(12) United States Patent
Yun et al.

(10) Patent No.: US 11,503,773 B2
(45) Date of Patent: *Nov. 22, 2022

(54) SUNLIGHT CONVERTING DEVICE COMPRISING WAVELENGTH CONVERTING FILM

(71) Applicant: SHERPA SPACE INC., Daejeon (KR)

(72) Inventors: Choa Mun Yun, Daejeon (KR); Wonjoon Choi, Daejeon (KR)

(*) Notice: Subject to any disclaimer, the term of this patent is extended or adjusted under 35 U.S.C. 154(b) by 122 days.

This patent is subject to a terminal disclaimer.

(21) Appl. No.: 17/095,005

(22) Filed: Nov. 11, 2020

(65) Prior Publication Data

US 2021/0105952 A1 Apr. 15, 2021

Related U.S. Application Data

(63) Continuation of application No. 16/282,353, filed on Feb. 22, 2019, now Pat. No. 10,863,678, which is a continuation of application No. PCT/KR2018/006689, filed on Jun. 14, 2018.

(51) Int. Cl.
| | |
|---|---|
| *A01G 9/24* | (2006.01) |
| *A01G 7/04* | (2006.01) |
| *H01L 31/0352* | (2006.01) |
| *A01G 33/00* | (2006.01) |
| *H01L 31/055* | (2014.01) |
| *H01L 31/0232* | (2014.01) |

(52) U.S. Cl.
CPC ............ *A01G 7/045* (2013.01); *A01G 9/243* (2013.01); *A01G 33/00* (2013.01); *H01L 31/02327* (2013.01); *H01L 31/035218* (2013.01); *H01L 31/055* (2013.01); *Y02A 40/25* (2018.01); *Y02B 10/10* (2013.01); *Y02E 10/52* (2013.01); *Y02P 60/12* (2015.11)

(58) Field of Classification Search
CPC . A01G 7/04; A01G 7/06; A01G 9/033; A01G 9/243; A01G 33/00; H01L 31/023; H01L 31/024; Y02E 10/46
USPC .......................................... 250/203.4, 214 R
See application file for complete search history.

(56) References Cited

U.S. PATENT DOCUMENTS 9,054,252 B1 * 6/2015 Gu .......................... F24S 50/20

* cited by examiner

*Primary Examiner* — Que Tan Le
(74) *Attorney, Agent, or Firm* — Harvest IP Law, LLP

(57) ABSTRACT

The present disclosure relates to a sunlight converting device including a wavelength converting film using a wavelength conversion material such as a quantum dot or an inorganic phosphor. More particularly, the present disclosure provides a sunlight converting device including a wavelength converting film using a wavelength conversion material, which can optimize plant growth and provide improved plant quality by installing a wavelength converting film on which a wavelength conversion material is applied so as to be converted into a predetermined wavelength and output to a greenhouse (glasshouse), a vinyl house or a microalga culture facility, varying the sunlight irradiation area of the wavelength converting film, and supplying light of various wavelengths required for species of plant including microalgae or growth cycles thereof.

12 Claims, 16 Drawing Sheets

⇒ PL of G & A of R overlap
  → Re-absorption occurs
  → EQE lowering

⇒ PL of R & A of G overlap
  → no re-absorption
  → higher EQE

OR

SUNLIGHT CONVERTING DEVICE COMPRISING WAVELENGTH CONVERTING FILM

CROSS REFERENCE TO RELATED APPLICATIONS

This application is a continuation application of U.S. application Ser. No. 16/282,353 filed Feb. 22, 2019, which is a continuation application of International Patent Application No. PCT/KR2018/006689 filed on Jun. 14, 2018, which claims priority from Korean Patent Application No. 10-2017-0074586 filed on Jun. 14, 2017, which is now Korean Patent No. 10-1795443, in the Korean Intellectual Property Office, the disclosures of which are incorporated in reference in their entireties.

TECHNICAL FIELD

The present disclosure relates to a sunlight converting device including a wavelength converting film that uses quantum dots or inorganic phosphors. More particularly, the present disclosure relates to a sunlight converting device comprising a wavelength converting film using quantum dots or inorganic phosphors, where a wavelength converting film coated with quantum dots or inorganic phosphors for converting irradiation into a predetermined wavelength and outputting the converted wavelength is installed in a greenhouse (glass greenhouse), a vinyl house, or a microalgae culture facility, and the region of the wavelength converting film irradiated by sunlight is varied so as to supply light in various wavelengths as needed by each species of plants, including microalgae, and as needed in each growth phase, so that the growth of the plants may be optimized, and the quality of the plants may be improved.

BACKGROUND ART

Plants serve an important role of providing nutrients and supplying oxygen to the ecosystem as chloroplasts of the plants perform carbon assimilation, which refers to the synthesis of carbohydrates from carbon gases and water by means of sunlight. To increase the efficiency of this process by which plants convert light energy into chemical energy, which process is known as photosynthesis, as well as the functions of the chlorophylls, there is required a light source for emitting irradiation of a particular wavelength band that can serve as a substitute for sunlight. The particular wavelength band may be different for each species of plants as well as for each growth phase.

The properties of sunlight differ depending on the day, time, location, and weather, and it may occur that the particular wavelength band needed for the plant growth is insufficient.

SUMMARY OF THE DISCLOSURE

Fluorescent lamps or high-pressure sodium lamps have been used to promote plant growth in glass or vinyl greenhouses. With fluorescent lamps or high-pressure sodium lamps, however, there is the drawback that it is not possible to provide high-intensity irradiation of only the wavelengths promoting plant growth, as these lamps also include large amounts of irradiation in wavelengths that are irrelevant to plant photosynthesis.

Also, whereas the incandescent, fluorescent, halogen-bulb, and high-pressure sodium lamps have been used in the past as lighting devices for growing plants, the energy-efficient and eco-friendly semiconductor light-emitting diode (hereinafter "LED") has been developed as a replacement.

To provide irradiation using the above plant growth LED in an optimum wavelength and brightness that can be adjusted according to the growth properties of the plants, Korean Registered Patent No. 10-0883691 discloses a technique of arranging various types of LEDs on a board in suitable proportions, and Korean Patent Publication No. 10-2004-0010426 discloses a system that uses LED lamps of 730 nm of far infrared light, 660 nm of red light, and 450 nm of blue light as light sources.

Since the technologies described above were developed for control systems, they can be difficult to use in general farm households and may not provide levels of productivity comparable to the costs of investment.

The problems above arise due to the fact that, although the LED lamp is being utilized in various ways, the LED lamp is typically manufactured with one type of light-emitting substance, the LED lamp is incapable of emitting irradiation of various wavelengths in a manner similar to natural light, and inorganic fluorescent bodies provide low efficiency in light emission and low color rendering indexes and thus cannot easily simulate natural light.

Korean Patent Publication No. 10-2013-0052306 discloses a plant lighting device in which one or more first LEDs and second LEDs are mounted in an integrated form on a module, where the first LEDs and the second LEDs are arranged to intersect one another, with the first LEDs and the second LEDs providing a chlorophyll activation wavelength 440~655 nm and a photosynthesis activation wavelength 430~670 nm. However, as the plant lighting device still provides light of limited and fixed wavelengths, it is limited in terms of providing irradiation of varying wavelengths.

Korean Registered Patent No. 10-1185618 discloses an LED for plant growth which uses a mixed arrangement of quantum dots that have different diameters from among one to five types, where light emitted from the LED passes through a filler layer containing quantum dots to be converted into wavelengths that increase the efficiency of the photosynthesis and chlorophyll actions necessary for plant cultivation.

Here, quantum dots refer to particles in which hundreds to thousands of specific atoms have gathered together, where the particles form semiconductor crystals with the quanta synthesized to a nanometer (nm) scale. When irradiated with ultraviolet rays, quantum dots may display different colors depending on the sizes of the particles, even if the particles are composed of the same components.

However, the LED for plant growth using quantum dots merely provide light of a fixed or limited range of wavelengths and cannot provide irradiation having the required wavelengths according to the growth of the plants.

In addition, US Patent Publication No. 2014/0366439 and US Patent Publication No. 2014/0352762 disclose a system which utilizes a light emitting sheet that contains dispersed fluorescent substances (fluorescent dye, conjugated polymers, or quantum dots), but the system is still unable to emit light with the various wavelengths required for each species and each growth phase of the plants.

Accordingly, the present disclosure has been conceived to resolve the problems described above, and an objective of the present disclosure is to provide a sunlight converting device comprising a wavelength converting film using quantum dots or inorganic phosphors, where a wavelength converting film coated with quantum dots or inorganic phosphors for converting irradiation into a predetermined wavelength and outputting the converted wavelength may be installed in a greenhouse (glass greenhouse), a vinyl house or a microalgae culture facility, and the region of the wavelength converting film irradiated by sunlight may be varied so as to supply light in various wavelengths as needed by each species of plants, including microalgae, and as needed in each growth phase, so that the growth of the plants may be optimized, and the quality of the plants may be improved.

The objectives of the embodiments of the present disclosure are not limited to the objective described above. Other objectives that have not been mentioned would be clearly apparent from the disclosure below to the person having ordinary skill in the field of art to which the present disclosure pertains.

An embodiment of the present disclosure, conceived to achieve the above-described objective, provides a sunlight converting device that includes: a wavelength converting unit, which includes a wavelength converting film coated with a wavelength conversion material for outputting light corresponding to a predetermined wavelength and which converts the wavelength of incident sunlight; a driving unit that changes the sunlight-irradiated region of the wavelength converting film by moving the wavelength converting unit; a control unit that controls the operation of the driving unit to adjust the wavelength outputted through the wavelength converting unit; and an image acquiring unit that acquires a growth state image of the plant or microalgae cultivated in the facility and transmits the growth state image to the control unit.

The wavelength converting unit may be installed at an upper part or a side part of the facility.

The wavelength converting film may include: a polymer resin that includes divided regions and includes a wavelength conversion material coated in each region, where the wavelength conversion material is configured to convert sunlight into light of a predetermined wavelength and output the converted light; a barrier film laminated on both surfaces of the polymer resin for preventing deterioration of the wavelength conversion material; and a composite material formed on at least one surface of the barrier film to provide a supporting force.

The sunlight converting device according to an embodiment of the present disclosure may further include a sensor unit that senses the state and wavelength of the sunlight, where the control unit may control the driving unit to adjust the sunlight-irradiated region of the wavelength converting unit depending on the state of the sunlight, which varies according to the day, time, location, and weather, based on the state and wavelength of the sunlight transmitted from the sensor unit.

In the sunlight converting device according to one embodiment, the wavelength converting unit may have the wavelength converting film wound around two rollers provided on both sides thereof. In this case, the sunlight-irradiated region of the wavelength converting film may be changed as the driving unit winds or unwinds the two rollers.

In the sunlight converting device according to one embodiment, the wavelength converting unit may have the wavelength converting film provided in the form of a foldable curtain. In this case, the sunlight-irradiated region may be changed as the driving unit folds or unfolds the wavelength converting film.

In the sunlight converting device according to one embodiment, the wavelength converting unit may have the wavelength converting film provided in multiple layers. In this case, the sunlight-irradiated region may be changed as the driving unit changes the position of each layer of the wavelength converting film composed of multiple layers.

In the sunlight converting device according to one embodiment, the wavelength converting film may include a plurality of separated regions, and the separated regions may include a first region including a wavelength conversion material that emits a red color; a second region including a wavelength conversion material that emits a green color; a third region including a wavelength conversion material that emits a blue color; a fourth region including a wavelength conversion material that emits an arbitrary color by including two or more of the wavelength converting materials emitting the red, green, and blue colors mixed together; a fifth region formed by stacking two or more of the wavelength converting materials emitting the red, green, blue, and arbitrary colors; a sixth region configured to allow the sunlight to be outputted as it is, and a seventh region configured to block the sunlight.

In the sunlight converting device according to one embodiment, the control unit may control the driving unit to adjust the sunlight-irradiated region of the wavelength converting unit by analyzing the growth state image of the plant or microalgae cultivated in the facility acquired by the image acquiring unit to analyze the required wavelength matching the growth phase of the plant or microalgae cultivated in the facility from a growth model DB (database) and controlling the driving unit such that the required wavelength is outputted.

An embodiment of the present disclosure, conceived to achieve the above-described objective, provides a plant cultivation method using a sunlight converting device that includes a wavelength converting film, where the method includes: an image information acquisition step in which a control unit receives image information of a cultivated plant or microalgae; a wavelength checking step in which the control unit analyzes the received image information and checks the wavelength information required according to the species and growth cycle of plants, including microalgae; an irradiation region setting step in which the control unit sets a sunlight-irradiated region of the wavelength converting film according to the checked wavelength information; a driving unit control step in which the control unit controls a driving unit such that the set sunlight-irradiated region of the wavelength converting film is exposed to the sun; and a feedback step of in which the control unit receives feedback, including the wavelength outputted from the sunlight converting device according to the control of the driving unit and the image information of the cultivated plant or microalgae.

In embodiments of the present disclosure, the wavelength conversion material may include either quantum dots or inorganic phosphors.

With a sunlight converting device including a wavelength converting film using quantum dots or inorganic phosphors according to an embodiment of the invention, a wavelength converting film coated with quantum dots or inorganic phosphors for converting irradiation into a predetermined wavelength and outputting the converted wavelength may be installed in a greenhouse (glass greenhouse), a vinyl house, or a microalgae culture facility, and the region of the wavelength converting film irradiated by sunlight may be varied to provide light in the wavelengths needed for each growth phase of the plants, including microalgae, and in the wavelengths needed for optimal growth for each plant species.

In addition, a sunlight converting device including a wavelength converting film using quantum dots or inorganic phosphors according to an embodiment of the invention can convert the short wavelength light (UV, Blue, 200 to 500 nm) of sunlight into light having the wavelengths required for each growth phase of the plants and wavelengths required for optimum growth for each species of the plants, thereby optimizing the growth of the plants and improving quality of the plants.

In addition, a sunlight converting device including a wavelength converting film using quantum dots or inorganic phosphors according to an embodiment of the invention can, in winter, provide an effect of heating the greenhouse (glass greenhouse) or vinyl house by converting unnecessary wavelengths of sunlight into infrared (IR) or near-infrared (NIR) wavelengths using a wavelength converting unit positioned at an upper part of a location where there are no plants being grown, thereby reducing wintertime fuel costs.

In addition, a sunlight converting device including a wavelength converting film using quantum dots or inorganic phosphors according to an embodiment of the invention can provide light optimized for the growth of plants, including microalgae, thereby allowing conservation in terms of auxiliary light sources and thus reducing electricity costs.

In addition, with a sunlight converting device including a wavelength converting film using quantum dots or inorganic phosphors according to an embodiment of the invention, the wavelength converting film can be utilized as a replacement for the existing screening facility (tent or vinyl film) applied for blocking ultraviolet (UV) rays and shielding light, so that the additional costs for installing a screening facility can be obviated, and unneeded wavelengths can be converted into and used for needed wavelengths.

In addition, a sunlight converting device including a wavelength converting film using quantum dots or inorganic phosphors according to an embodiment of the invention can actively provide customized wavelengths based on the state of sunlight, which changes according to the day, time, location, and weather.

DETAILED DESCRIPTION OF THE DISCLOSURE

Figure 1:
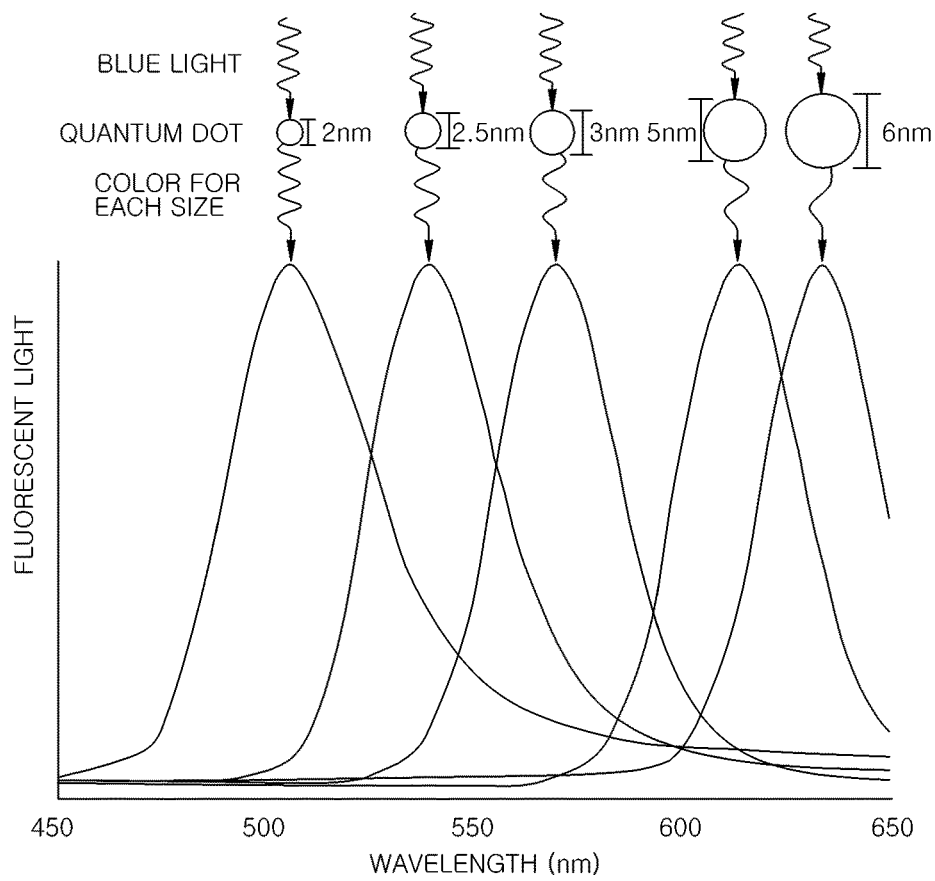
FIGS. 1 and 2 are diagrams illustrating quantum dots used in the present disclosure.

As the present disclosure allows for various modifications and alternative forms, specific embodiment of the invention are illustrated as examples in the drawings and in the detailed descriptions below. It should be understood, however, that the present disclosure is not intended to be limited to the specific embodiments but rather encompasses all modifications, equivalents, and substitutes falling within the spirit and the scope of the present disclosure.

When an element is referred to as being "connected" or "coupled" to another element, it is to be understood that the element may be directly connected or coupled to the other element, but also that one or more other components may be present therebetween.

In contrast, when an element is referred to as being "directly connected" or "directly coupled" to another element, it is to be understood that there are no other elements present therebetween.

The terminology used herein is used for the purpose of describing a particular embodiment only and is not intended to limit the present disclosure. The singular expression encompasses the meaning of plural expressions unless the context clearly describes otherwise. In the present application, it is to be understood that terms such as "include", "have" or the like are intended to specify the existence of the feature, number, process, operation, element, component or combination thereof described in the specification and do not preclude the existence or possible addition of one or more other features, numbers, processes, operations, elements, components, or combinations thereof.

Unless defined otherwise, all terms used herein, including technological or scientific terms, have the same meaning as those commonly understood by the person having ordinary skill in the field of art to which the present disclosure pertains. Terms such as those defined in a commonly used dictionary are to be construed as having a meaning consistent with the meaning in the context of the relevant art and are not to be construed as ideal or overly formal in meaning unless explicitly defined in the present application.

Hereinafter, the present disclosure will be described in more detail with reference to the accompanying drawings. Prior to this, terms and words used in the present specification and claims should not be construed as limited to ordinary or dictionary meanings and should be construed in light of the meanings and concepts consistent with the technical idea of the present disclosure, based on the principle that the inventor can suitably define a concept of a term in order to describe the invention in the best possible way. In addition, unless otherwise defined, the technical terms and scientific terms used herein have the meanings as commonly understood by the person having ordinary skill in the field of art to which the present disclosure pertains, and descriptions of known functions and configurations that may unnecessarily obscure the essence of the present disclosure will be omitted in the following description and the accompanying drawings. The drawings that follow are provided as examples such that those skilled in the art can sufficiently understand the spirit of the present disclosure. Therefore, the present disclosure is not limited to the drawings provided below and may be embodied in other forms. In addition, the same reference numerals designate the same elements throughout the specification. It is to be noted that the same elements in the drawings are denoted by the same reference numerals wherever possible.

In the embodiments of the present disclosure, quantum dots or inorganic phosphors can be used to selectively output a specific wavelength of incident light.

Figure 2:
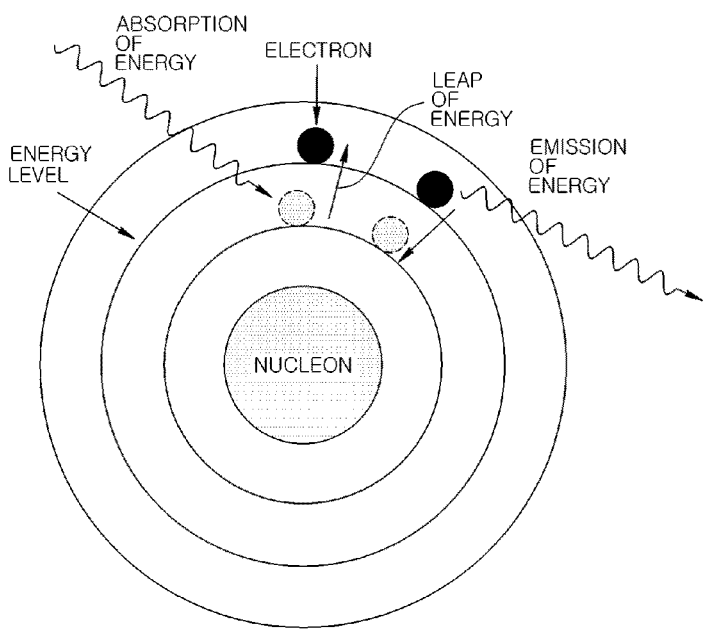

FIGS. 1 and 2 are diagrams illustrating quantum dots used in the present disclosure.

A quantum dot is a semiconductor crystal in which quanta have been synthesized to a nanometer (nm) scale. When ultraviolet rays (blue light) are applied, the quantum dots exhibit various colors depending on the sizes of the particles even when the particles are of the same component, and such a property is better exhibited in semiconductor materials than in regular materials. Elements such as cadmium, cadmium sulfide, cadmium selenide, and indium phosphide, which have a strong tendency to exhibit the above-mentioned property, are utilized in quantum dot semiconductor crystals. A recent implementation includes a zinc-selenium-sulfur alloy (ZnSeS) enveloped around an indium phosphide core to avoid the use of the heavy metal cadmium.

As illustrated in FIG. 1, if the quantum dot is small, the quantum dot emits a visible light having a short wavelength such as green, and as the size increases, the quantum dot emits the visible light having a longer wavelength such as red. In general, the bandgap energy is controlled according to the size of the quantum dot, owing to the quantum confinement effect, and thereby, energy of various wavelengths is emitted. That is, the quantum dot emits light as the energy level of the electrons is lowered within the quantum dot, and the larger the quantum dot is, the narrower the gap between energy levels is, whereby a red color corresponding to a longer wavelength and a relatively low energy is emitted. (Source of FIG. 1: http://informationdisplay.org)

The quantum confinement effect is a phenomenon in which, for a particle in the scale of a few tens of nanometers or smaller, the wall of a space causes the electrons to form a discontinuous energy state, where the smaller the size of the space, the higher the energy state of the electrons and the wider the energy band.

Referring to FIG. 2, a principle of the quantum dot is that, in a material with clusters of quanta, particularly in semiconductor material, an application of energy from ultraviolet rays or the like causes the electrons within the material to move to a higher energy level by way of a quantum jump and then emit energy to go back down to a lower energy level, the above process being repeated continuously. Here, energy of various wavelengths is emitted depending on the size of the quantum dot. If the wavelength (energy) is within the visible region (380 nm to 800 nm), then various colors visible to the eye are emitted as wavelengths of energy forms.

That is, if the quantum dot absorbs light from an excitation source and reaches an energy-excited state, the quantum dot emits energy corresponding to an energy band gap of the quantum dot. Therefore, by controlling the size or material composition of the quantum dot, it is possible to control the energy band gap, and thereby, light can be emitted in any of the regions from the ultraviolet region to the infrared region.

The quantum dot may be produced by a vapor deposition method such as a metal organic chemical vapor deposition (MOCVD) method or a molecular beam epitaxy (MBE) method, or may be produced by a chemical wet synthesis method. Since the quantum dots produced by the chemical wet synthesis method are dispersed in a solvent in a colloidal state, the quantum dots are separated from the solvent through centrifugation, and the separated quantum dots can be dispersed in a prepared metal-organic precursor solution. Here, the quantum dots can be stabilized by bonding with an organic matter of the metal-organic precursor.

Figure 3:
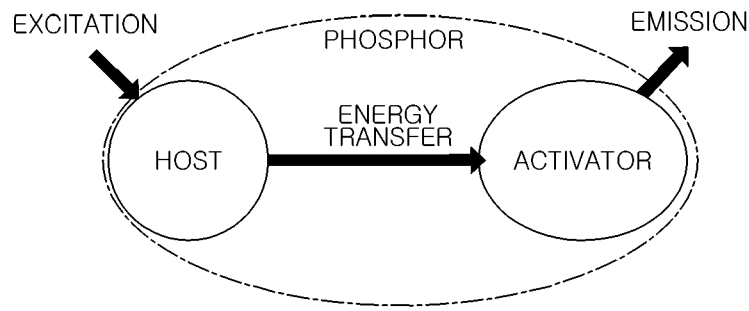
FIG. 3 is a diagram illustrating an inorganic phosphor used in the present disclosure.

Next, FIG. 3 illustrates the principle by which an inorganic phosphor emits light.

When a certain type of energy enters a particle, a certain action within the particle may generate a visible light, and such a process is referred to as luminescence. Describing the principle by which a phosphor exhibits luminescence, when a phosphor receives energy, a free electron and a hole are formed, creating a higher-level energy state. As the phosphor returns to a stabilized state, the energy is emitted as visible light. A phosphor is composed of a host material and activators, which are impurities mixed in at appropriate positions, where the activators determine the energy level involved in the light emission process and thus determine the color of the light emitted by the phosphor.

Therefore, by coating or applying phosphors that contain activators for emitting light of specific wavelengths onto differentiated regions of a transparent material and then irradiating artificial light as from an LED, one may utilize the principle that only light having the specific wavelengths preset by the user according to the properties of the phosphors may be outputted. Of course, it is also possible to set a third wavelength by using a method of mixing and distributing at least two or more phosphors in a certain coating region of the film.

Table 1 below shows the effect of light wavelength on plants. As shown in Table 1, plants generally receive the energy required for plant growth in the blue wavelength region or the red wavelength region. For plant growth, photosynthesis and chlorophyll activation, for example, are of great importance. Photosynthetic activity is maximized at wavelengths near 430 nm and near 670 nm. Chlorophyll activation can be maximized at wavelengths around 440 nm and around 655 nm.

TABLE 1

| | | Wavelength (nm) | Effect |
|---|---|---|---|
| Infrared Ray | IR-A | 1400~1000 | no special effect on plants, applies thermal effect |
| | | 780 | promotes specific growth effects on plants |
| Visible Ray | red | 700 | prevents germination (730), maximizes photosynthesis (670) |
| | | 660 | maximizes chlorophyll action (655), promotes germination and forming of leaves, germinal vesicles, and flower buds (660) |
| | reddish yellow | 610 | not beneficial to photosynthesis, controls harmful insects (580~650) |
| | greenish yellow | 510 | partially absorbed by yellow pigment |
| | blue | 430~440 | maximizes photosynthesis (430) maximizes chlorophyll action (440) attracts harmful insects |
| UV-Ray | UV-A | 400~315 | generally thickens leaves of plants, promotes color development of pigments, attracts harmful insects |
| | UV-B | 280 | has important functions in many synthesis processes (forms immune bodies), is harmful if too strong |
| | UV-C | 100 | causes plants to rapidly wither |

(Source of Table 1: http://www.parus.co.kr/main.php?mm=s13)

A sunlight converting device including a wavelength converting film that uses quantum dots or inorganic phosphors according to an embodiment of the present disclosure may also be applied to a microalgae cultivation facility. Microalgae are also known as phytoplankton. Among lower plants whose roots, stems, and leaves are not systematically differentiated, plants that photosynthesize by using chlorophyll are called algae, and algae are divided into marine algae such as seaweed and kelp that adhere to a solid structure for habitation, and microalgae that cannot be seen by the naked eyes, can only be seen through a microscope, and float freely and live in water. Microalgae refer to single-cell algae that are smaller than or equal to 50 μm. As lipids and oils extracted from microalgae can be used with a catalyst to produce biofuel, there is ongoing research on their potential for future resources.

White light providing a wavelength of 400-700 nm contributes to a higher microalgae production rate than the conditions of red light or blue light, and as a result of checking the effect of wavelength mixed proportions on microalgae growth by changing the mixed proportion of the red light and blue light, it is known that a mixed irradiation of red light and blue light provides an approximately 50% higher microalgae production rate than light of a single wavelength regardless of the mixed proportion.

Similarly to the case of plants, the growth microalgae is also affected by light intensity during phototrophic cultivation, being dependent on the light wavelengths, cell concentration, culture density, penetration distance of light, and geometric shape of the photobioreactor.

Figure 4:
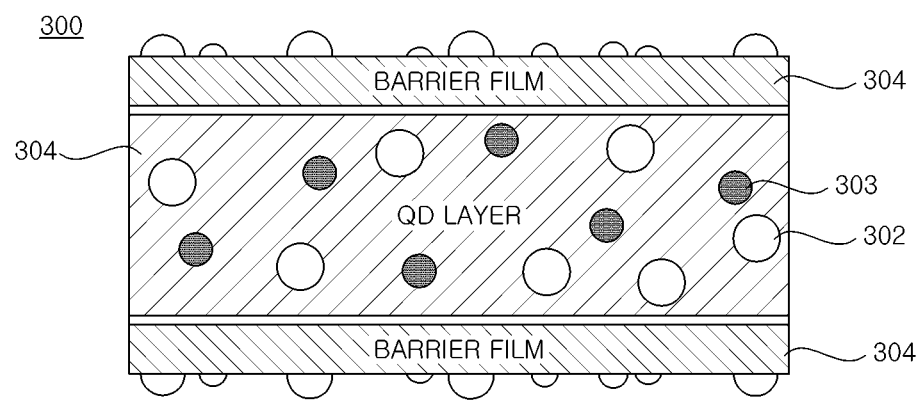
FIG. 4 is a cross-sectional view of a wavelength converting film according to one embodiment of the present disclosure.
Figure 5:
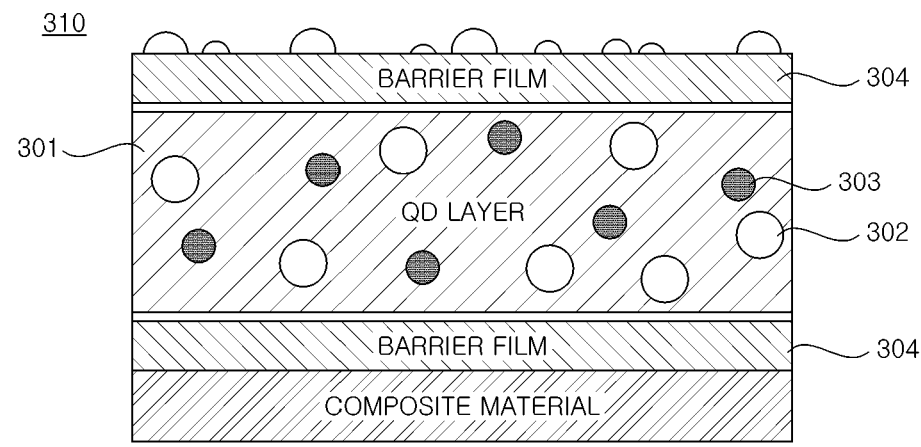
FIG. 5 is a cross-sectional view of a wavelength converting film according to another embodiment of the present disclosure.

FIG. 4 is a cross-sectional view of a wavelength converting film according to an embodiment of the present disclosure, and FIG. 5 is a cross-sectional view of a wavelength converting film according to another embodiment of the present disclosure.

A wavelength converting film 300 according to an embodiment of the present disclosure illustrated in FIG. 4 is formed by coating a polymer resin (QD layer, polymer matrix) 301 with quantum dots 302 and 303 or inorganic phosphors (not illustrated), and then, laminating both surfaces each with a barrier film 304 of a polyester (PET) material to suppress the deterioration of the quantum dots 302 and 303 or inorganic phosphors caused by moisture or oxygen.

A wavelength converting film 310 according to another embodiment of the present disclosure illustrated in FIG. 5 is formed by coating the polymer resin (QD layer) 301 with the quantum dots 302 and 303 or the inorganic phosphors (not illustrated), laminating both surfaces each with the barrier film 304 of a PET material to suppress the deterioration of the quantum dots 302 and 303 or inorganic phosphors caused by moisture or oxygen, and further laminating one surface of a barrier film 304 with a composite material 305 providing a supporting force, thereby ensuring the durability of the wavelength converting film 310. While it is not illustrated in the figures, it is also possible to form the wavelength converting film such that the polymer resin 301 coated with the quantum dots 302 and 303 or the inorganic phosphors is laminated on one surface with the barrier film 304 and laminated on the other surface with the composite material 305.

Although FIGS. 4 and 5 illustrate two types of quantum dots 302 and 303 having different sizes being coated on, the sizes of the coated quantum dots may differ depending on the wavelengths which the light is to be converted to and emitted in. If inorganic phosphors are applied instead of quantum dots, inorganic phosphors of different colors may be applied for each type of wavelength.

Hereinafter, a material for selectively outputting a specific wavelength such as the quantum dot or the inorganic phosphor is collectively referred to as a wavelength conversion material.

Figure 6:
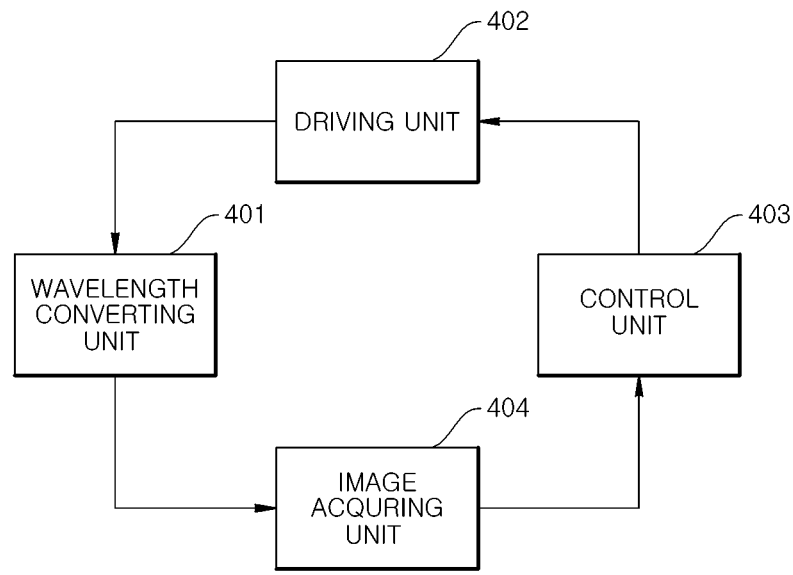
FIG. 6 is a configuration diagram illustrating a sunlight converting device including a wavelength converting film using a wavelength conversion material according to an embodiment of the present disclosure.

FIG. 6 is a configuration diagram illustrating a sunlight converting device including a wavelength converting film using a wavelength conversion material according to an embodiment of the present disclosure.

As illustrated in FIG. 6, the sunlight converting device including a wavelength converting film using a wavelength conversion material according to an embodiment of the present disclosure includes a wavelength converting unit 401, a driving unit 402, and a control unit 403.

The wavelength converting unit 401 includes a wavelength converting film on which a plurality of separated regions are each coated with a wavelength conversion material for outputting light corresponding to a predetermined wavelength. Various embodiments of the wavelength converting unit 401 will be described later on with reference to FIGS. 15 to 17.

The driving unit 402 changes the position and form of the wavelength converting unit 401 to change the sunlight-irradiated region, and at least one driving unit may be provided.

The control unit 403 controls the operation of each of the driving units 402 such that a portion of the wavelength converting unit 401 capable of outputting a required wavelength is exposed to the sun and thus adjusts the wavelength outputted from the sunlight converting device.

More specifically, the control unit 403 changes the position of the wavelength converting unit 401 to match the growth phase of the plants by referencing information on the required wavelengths and mixed proportions of the wavelengths, which change according to the growth phase of the plants, including microalgae, as well as information on the wavelengths that are outputted as a result of controlling the exposure region of the wavelength converting unit 401, and thus adjusts the wavelength outputted from the sunlight converting device.

That is, the sunlight converting device including a wavelength converting film using a wavelength conversion material emits light of a variable wavelength obtained by combining a plurality of wavelengths.

A sunlight converting device including a wavelength converting film using a wavelength conversion material according to an embodiment of the present disclosure further includes an image acquiring unit 404.

When the image acquiring unit 404 acquires an image of the growth state of the plants or microalgae cultivated in a greenhouse (glass greenhouse), vinyl house, or microalgae culture facility and transfers the image to the control unit 403, the control unit 403 analyzes the necessary wavelengths according to the growth phase of the currently cultivated plants or microalgae from a growth model DB (database) and adjusts the sunlight-irradiated region of the wavelength converting unit 401 by controlling the driving unit 402 such that a required wavelength is outputted.

In order that the wavelengths needed more by the plants may be supplied, the image acquiring unit 404 provides an image analysis feedback, based on which the position of the wavelength converting unit 401 may be changed and the sunlight-irradiated region may be controlled, to supply the plants with the light having adjusted wavelengths.

A sunlight converting device including a wavelength converting film using a wavelength conversion material according to an embodiment of the present disclosure may further include a sensor unit (not illustrated) that senses the status and wavelength of the sunlight.

The control unit may control the driving unit 402 such that the sunlight-irradiated region of the wavelength converting unit 401 is adjusted in accordance with the state of the sunlight, which is changed according to the day, time, location, and weather, based on the state and wavelength of the sunlight received from the sensor unit.

Table 2 below shows the combination of wavelengths needed for each phase of plant growth.

TABLE 2

| | Growth Phase | Effect | Mode | Effective Wavelength | Mixed Proportions |
|---|---|---|---|---|---|
| 1 | Blossoming (Germination) | Induce Germination | A | red, blue, far-red | a:b:c |
| 2 | Vegetative Growth | Growth Control (Cell Division and Growth) | B | red, blue, far-red | d:e:f |
| | | | C | blue | g |
| | | Shape Forming | D | red, blue, far-red | h:i:j |
| | | | E | blue | h |
| | | Phototropism | F | blue | l |
| | | Open Pores | G | blue | m |
| | | Chloroplast Action | H | blue | n |
| 3 | Reproductive Growth | Flower Bud Formation | I | red, blue, far-red | o:p:q |
| | | | | blue | r |
| 4 | Aging | Pigment Synthesis/ Creation | J | red, blue, far-red | s:t:u |
| | | | | blue | v |

As shown in Table 2, the required wavelengths vary depending on the growth phases of the plants as well as the plant species. The mixed proportions a to v in Table 2 can be set to arbitrary proportions depending on the growth phases of the plant and the plant species. As such, the present disclosure provides a sunlight converting device that outputs light with variable wavelengths in accordance with the growth phases. (Source of Table 2: Gyeongsangbuk-do Agricultural Research and Extension Services (Publication No. 75-6470332-000114-01) Technology Manual for Cultivating Lettuce, Ice Plant, and Watercress using an LED Plant Factory)

Below, a description is provided, with reference to FIGS. 7 to 13, of example implementations of a sunlight converting device including a wavelength converting film using a wavelength conversion material according to an embodiment of the present disclosure.

Figure 7:
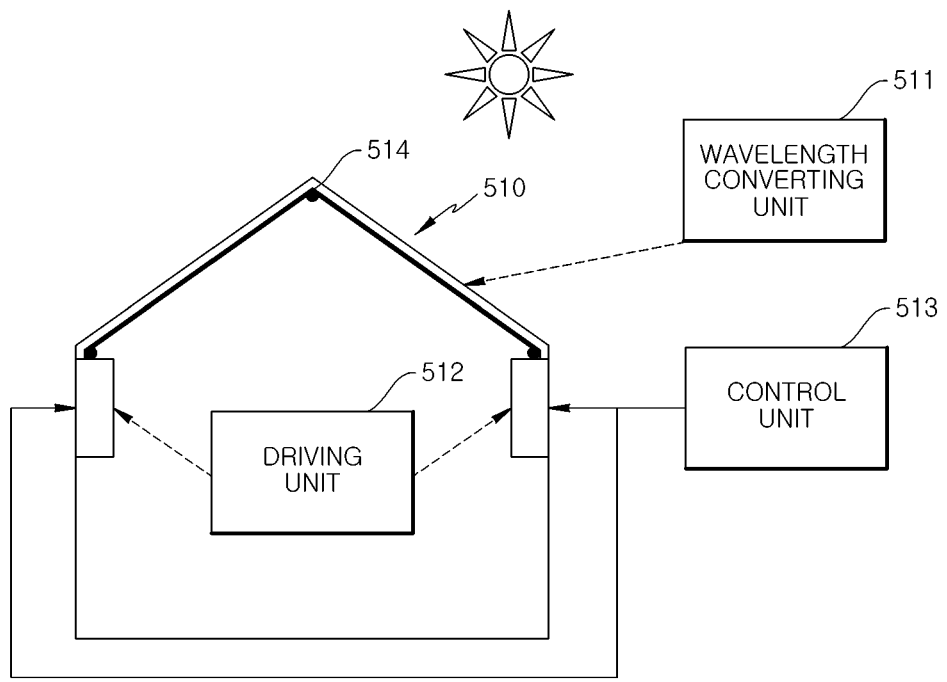
FIG. 7 is a diagram illustrating a first example implementation of a sunlight converting device including a wavelength converting film using a wavelength conversion material according to an embodiment of the present disclosure.

FIG. 7 is a diagram illustrating a first example implementation of a sunlight converting device including a wavelength converting film using a wavelength conversion material according to an embodiment of the present disclosure.

As illustrated in FIG. 7, the sunlight converting device including a wavelength converting film using a wavelength conversion material includes a wavelength converting unit 511, a driving unit 512, and a control unit 513.

The wavelength converting unit 511 includes a wavelength converting film that has a wavelength conversion material for outputting light corresponding to a predetermined wavelength coated in each of a plurality of separated regions.

The driving unit 512 changes the sunlight-irradiated region of the wavelength converting unit 511.

The control unit 513 controls the operation of the driving unit 512 provided on both sides, according to growth information of the plants, including microalgae, for each species and each growth cycle, to adjust the wavelength outputted through the wavelength converting unit 511.

The wavelength converting unit (wavelength converting film) 511 of FIG. 7 is installed under the top vinyl or glass element of the facility (a greenhouse (glass greenhouse), vinyl house, or microalgae culture facility) 510.

In addition, a roll type frame 514 is provided at a center part of the facility 510 so as to support the wavelength converting unit (wavelength converting film) 511 and facilitate movement.

Figure 8:
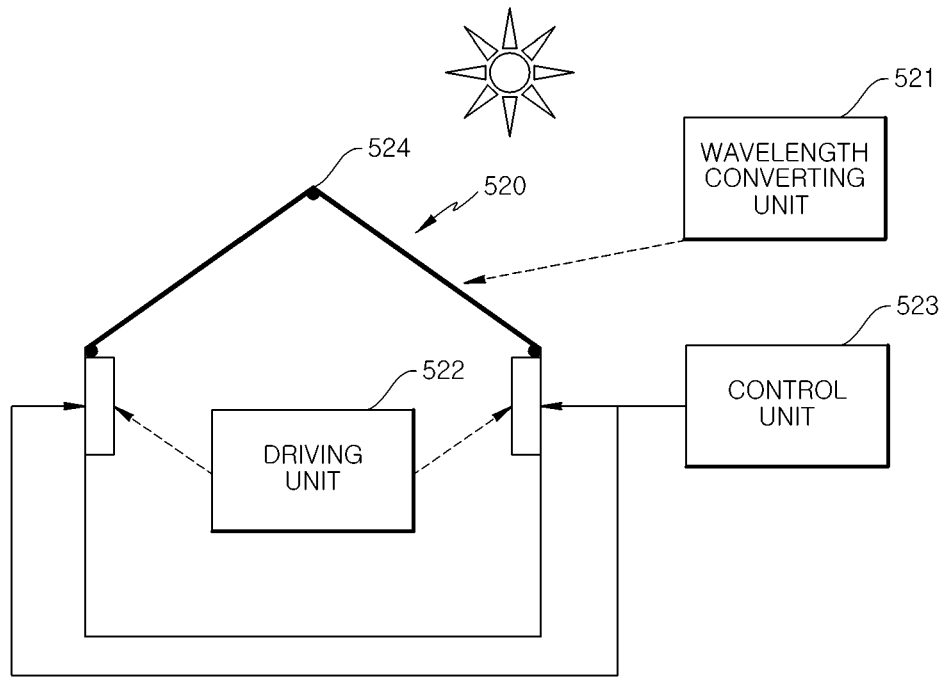
FIG. 8 is a diagram illustrating a second example implementation of a sunlight converting device including a wavelength converting film using a wavelength conversion material according to an embodiment of the present disclosure.

FIG. 8 is a diagram illustrating a second example implementation of a sunlight converting device including a wavelength converting film using a wavelength conversion material according to an embodiment of the present disclosure.

As illustrated in FIG. 8, a sunlight converting device including a wavelength converting film using a wavelength conversion material includes a wavelength converting unit 521, a driving unit 522, and a control unit 523.

The wavelength converting unit 521 includes a wavelength converting film that has a wavelength conversion material for outputting light corresponding to a predetermined wavelength coated in each of a plurality of separated regions.

The driving unit 522 changes the sunlight-irradiated region of the wavelength converting unit 521.

The control unit 523 controls the operation of the driving unit 522 provided on both sides, according to growth information of the plants, including microalgae, for each species and each growth cycle, to adjust the wavelength outputted through the wavelength converting unit 521.

The wavelength converting unit (wavelength converting film) 521 of FIG. 8 may be installed as a substitute for the bottom of the top vinyl or glass element of the facility (a greenhouse (glass greenhouse), vinyl house, or microalgae culture facility) 520.

In addition, a roll type frame 524 is provided at a center part of the facility 520 so as to support the wavelength converting unit (wavelength converting film) 521 and facilitate movement.

Figure 9:
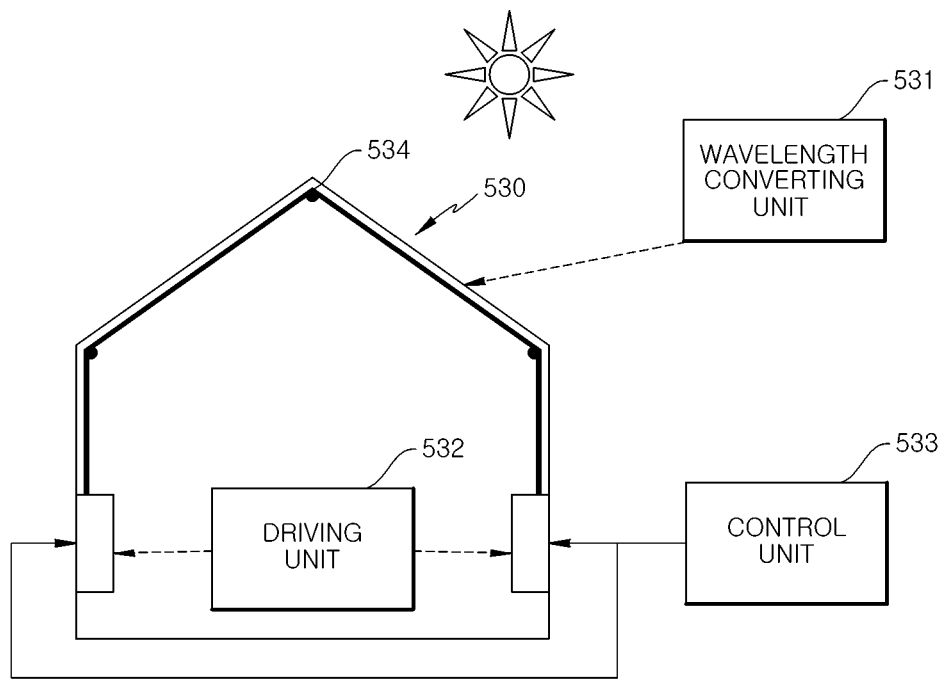
FIG. 9 is a diagram illustrating a third example implementation of a sunlight converting device including a wavelength converting film using a wavelength conversion material according to an embodiment of the present disclosure.

FIG. 9 is a diagram illustrating a third example implementation of a sunlight converting device including a wavelength converting film using a wavelength conversion material according to an embodiment of the present disclosure.

As illustrated in FIG. 9, a sunlight converting device including a wavelength converting film using a wavelength conversion material includes a wavelength converting unit 531, a driving unit 532, and a control unit 533.

The wavelength converting unit 531 includes a wavelength converting film that has a wavelength conversion material for outputting light corresponding to a predetermined wavelength coated in each of a plurality of separated regions.

The driving unit 532 changes the sunlight-irradiated region of the wavelength converting unit 531.

The control unit 533 controls the operation of the driving unit 532 provided on both sides, according to growth information of the plants, including microalgae, for each species and each growth cycle, to adjust the wavelength outputted through the wavelength converting unit 531.

The wavelength converting unit (wavelength converting film) 531 of FIG. 9 is installed on the inside of the vinyl or glass at the top and side parts of the facility (a greenhouse (glass greenhouse), vinyl house, or microalgae culture facility) 530.

In addition, a roll type frame 534 is provided at a center part of the facility 530 so as to support the wavelength converting unit (wavelength converting film) 531 and facilitate movement. The roll type frame 534 may also be provided at the bent parts at the corners where the upper surface is joined to a side surface.

Figure 10:
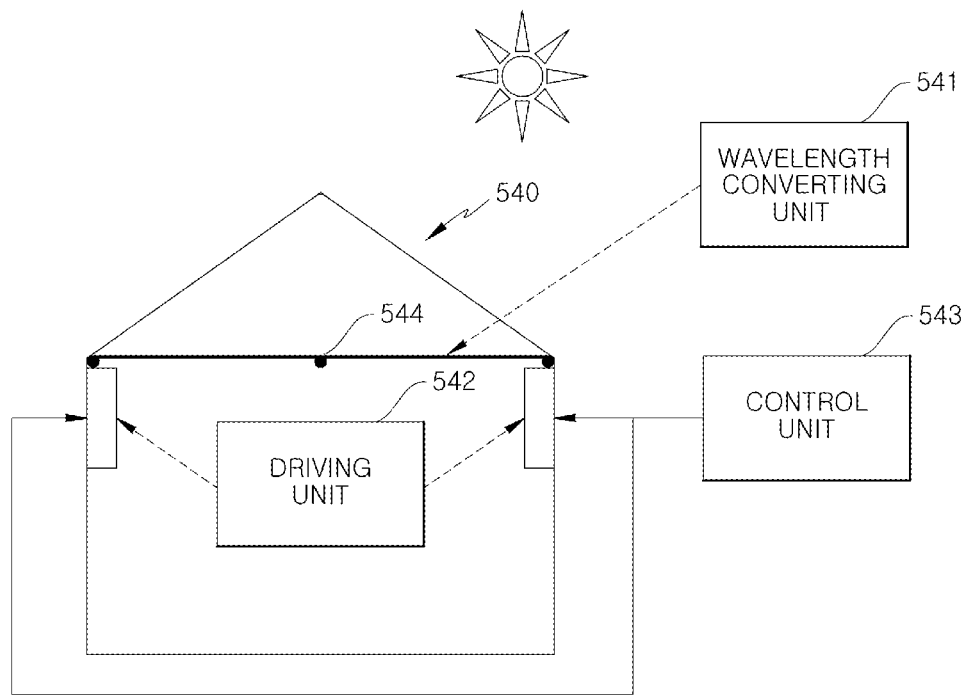
FIG. 10 is a diagram illustrating a fourth example implementation of a sunlight converting device including a wavelength converting film using a wavelength conversion material according to an embodiment of the present disclosure.

FIG. 10 is a diagram illustrating a fourth example implementation of a sunlight converting device including a wavelength converting film using a wavelength conversion material according to an embodiment of the present disclosure.

As illustrated in FIG. 10, a sunlight converting device including a wavelength converting film using a wavelength conversion material includes a wavelength converting unit 541, a driving unit 542, and a control unit 543.

The wavelength converting unit 541 includes a wavelength converting film that has a wavelength conversion material for outputting light corresponding to a predetermined wavelength coated in each of a plurality of separated regions.

The driving unit 542 changes the sunlight-irradiated region of the wavelength converting unit 541.

The control unit 543 controls the operation of the driving unit 542 provided on both sides, according to growth information of the plants, including microalgae, for each species and each growth cycle, to adjust the wavelength outputted through the wavelength converting unit 541.

The wavelength converting unit (wavelength converting film) 541 of FIG. 10 is installed in a linear shape at the top of the facility (a greenhouse (glass greenhouse), vinyl house, or microalgae culture facility) 540.

In addition, a roll type frame 544 is provided at a center part of the facility 540 so as to support the wavelength converting unit (wavelength converting film) 541 and facilitate movement.

Figure 11:
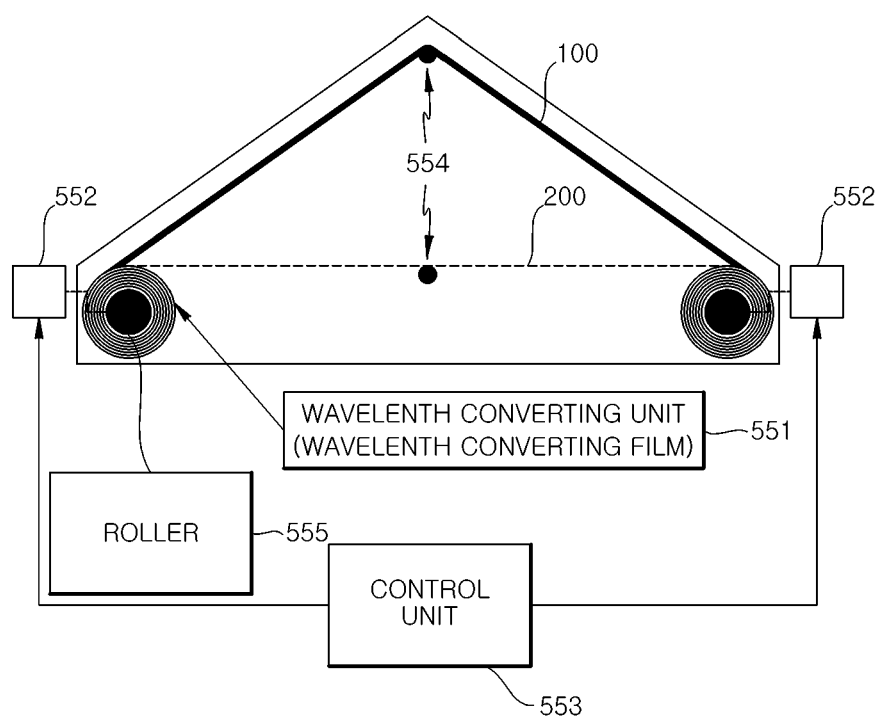
FIG. 11 is a diagram illustrating a fifth example implementation of a sunlight converting device including a wavelength converting film using a wavelength conversion material according to an embodiment of the present disclosure.

FIG. 11 is a diagram illustrating a fifth example implementation of a sunlight converting device including a wavelength converting film using a wavelength conversion material according to an embodiment of the present disclosure.

As illustrated in FIG. 11, a sunlight converting device including a wavelength converting film using a wavelength conversion material includes a wavelength converting unit (wavelength converting film) 551, motors 552 on both sides, and a control unit 553.

The wavelength converting film 551 may be formed in the shape 100 of the roof at the upper part of the facility or may be formed in a linear shape 200 at an upper part of the facility.

The motors 552 on both sides adjust the wavelength converting film 551 to be wound or unwound on the shafts (rollers) 555 under the control of the control unit 553, to change the sunlight-irradiated region.

In addition, a roll type frame 554 is provided at a center part of the facility so as to support the wavelength converting unit (wavelength converting film) 551 and facilitate movement.

Figure 12:
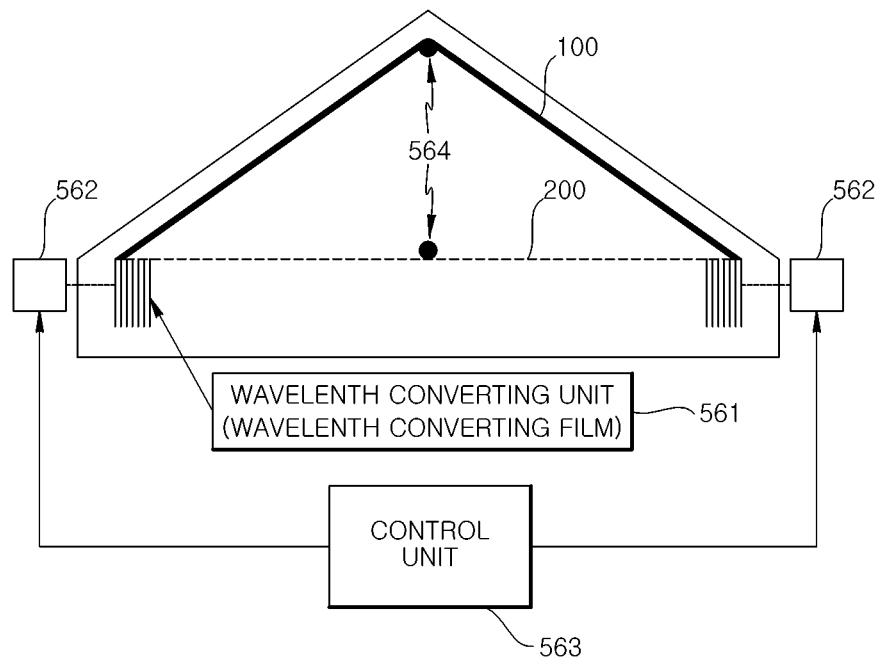
FIG. 12 is a diagram illustrating a sixth example implementation of a sunlight converting device including a wavelength converting film using a wavelength conversion material according to an embodiment of the present disclosure.

FIG. 12 is a diagram illustrating a sixth example implementation of a sunlight converting device including a wavelength converting film using a wavelength conversion material according to an embodiment of the present disclosure.

As illustrated in FIG. 12, a sunlight converting device including a wavelength converting film using a wavelength conversion material includes a wavelength converting unit (wavelength converting film) 561, motors 562 on both sides, and a control unit 563.

The wavelength converting film 561 may be formed in the shape 100 of the roof at the upper part of the facility or may be formed in a linear shape 200 at an upper part of the facility. Both sides of the wavelength converting film 561 may be adjusted such that the film is folded and unfolded like a foldable curtain.

The motors 562 on both sides adjust the wavelength converting film 561 to be folded or unfolded under the control of the control unit 563, to change the sunlight-irradiated region.

In addition, a roll type frame 564 is provided at a center part of the facility so as to support the wavelength converting unit (wavelength converting film) 561 and facilitate movement.

Figure 13:
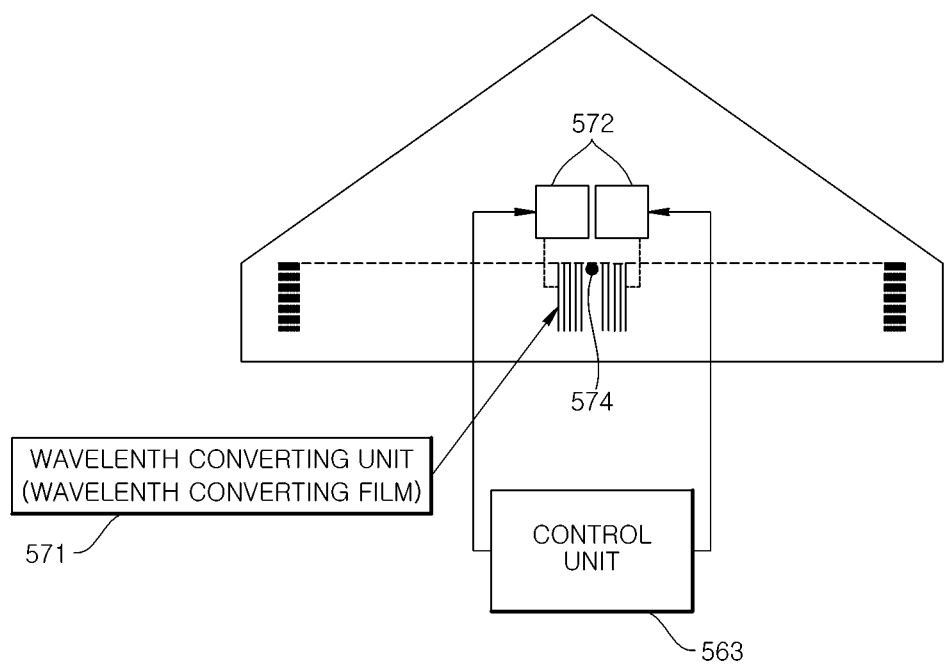
FIG. 13 is a diagram illustrating a seventh example implementation of a sunlight converting device including a wavelength converting film using a wavelength conversion material according to an embodiment of the present disclosure.

FIG. 13 is a diagram illustrating a seventh example implementation of a sunlight converting device including a wavelength converting film using a wavelength conversion material according to an embodiment of the present disclosure.

As illustrated in FIG. 13, a sunlight converting device including a wavelength converting film using a wavelength conversion material includes a wavelength converting unit (wavelength converting film) 571, a central motor 572, and a control unit 573.

The wavelength converting film 571 is formed in a linear shape 200 at an upper part of the facility. The wavelength converting film 571 has a centralized foldable curtain shape, and may be adjusted such that the film is folded like a curtain toward the center and both ends of the film are moved towards both sides when unfolded.

Figure 14:
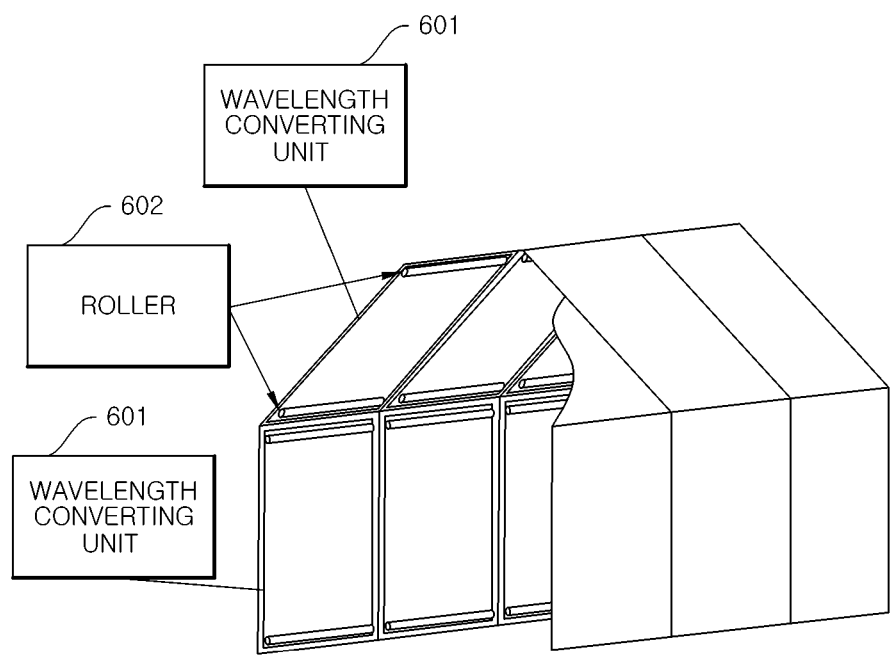
FIG. 14 is a diagram illustrating an example sunlight converting device including a wavelength converting film using a wavelength conversion material according to another embodiment of the present disclosure.

The central motor 572 adjusts the wavelength converting film 571 to be folded or unfolded under the control of the control unit 573, to change the sunlight-irradiated region. FIG. 14 is a diagram illustrating an example sunlight converting device including a wavelength converting film using a wavelength conversion material according to another embodiment of the present disclosure.

The sunlight converting devices illustrated in FIGS. 7 to 13, each including a wavelength converting film using a wavelength conversion material, cover the entire upper part of the facility with the wavelength converting film.

However, as illustrated in FIG. 14, a sunlight converting device including a wavelength converting film using a wavelength conversion material includes a plurality of window type wavelength converting units 601 provided on the upper and side parts of a facility 600 and driving units 602 that vary the sunlight-irradiated regions of the respective wavelength converting units 601.

Each separate window-type wavelength converting unit (wavelength converting film) 601 is adjusted such that the wavelength converting film is wound and unwound by a spiral wound type driving unit 602.

Figure 15:
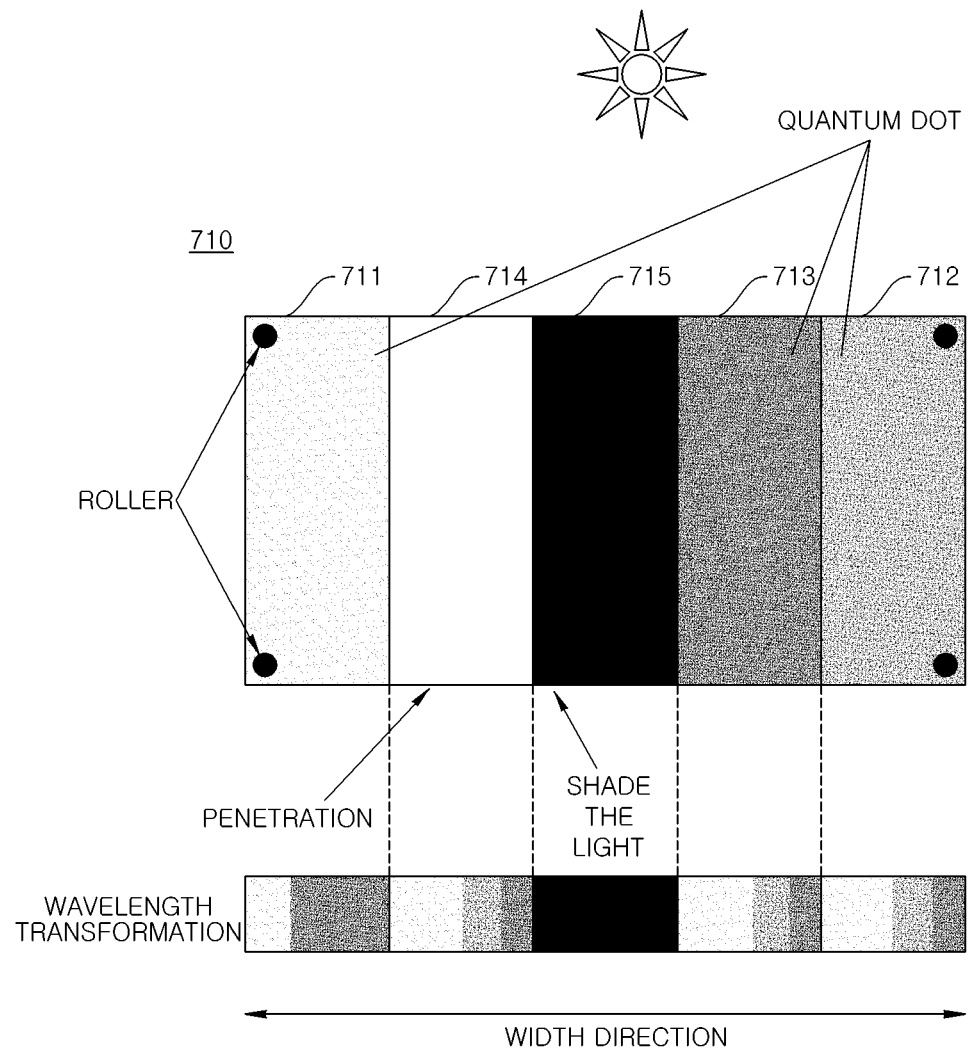
FIG. 15 is a diagram illustrating a wavelength converting unit according to an embodiment of the present disclosure.
Figure 16:
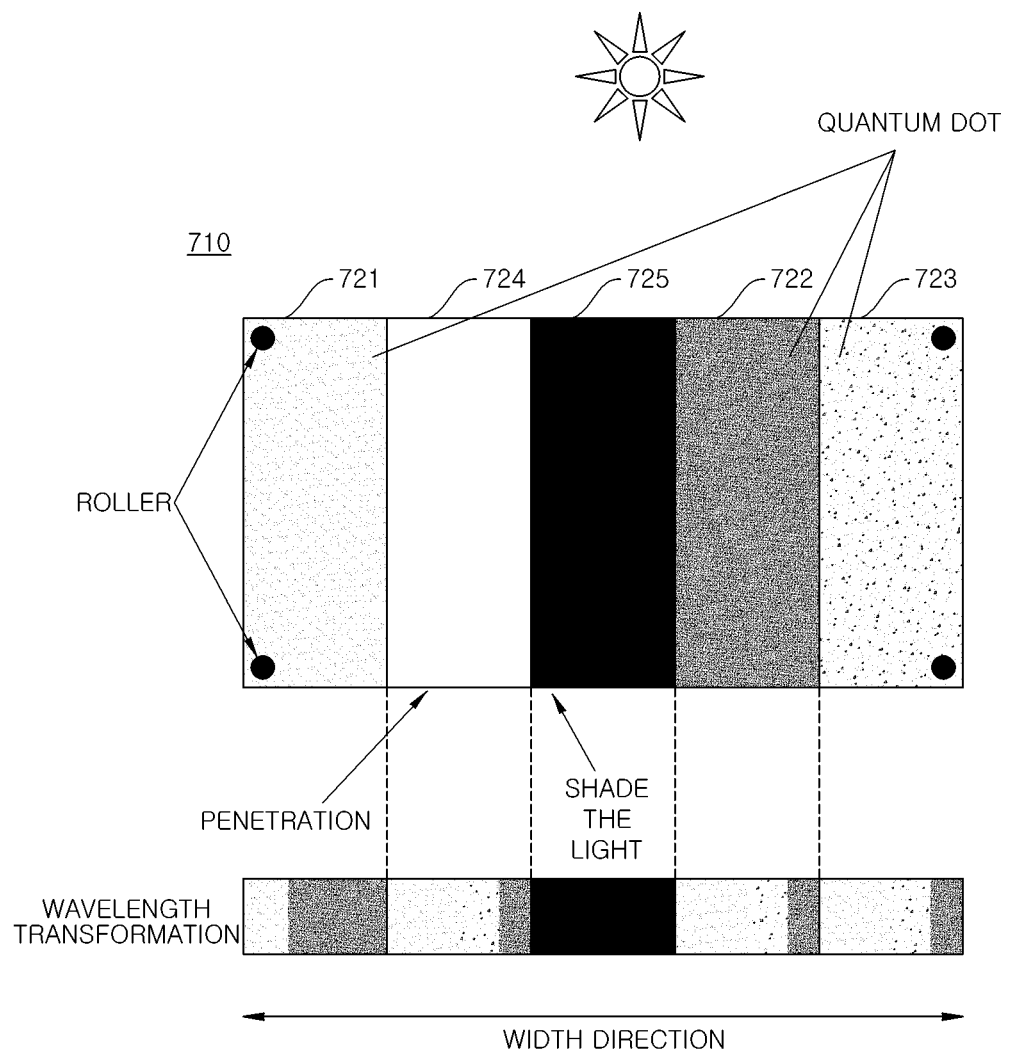
FIG. 16 is a diagram illustrating a wavelength converting unit according to another embodiment of the present disclosure.
Figure 17:
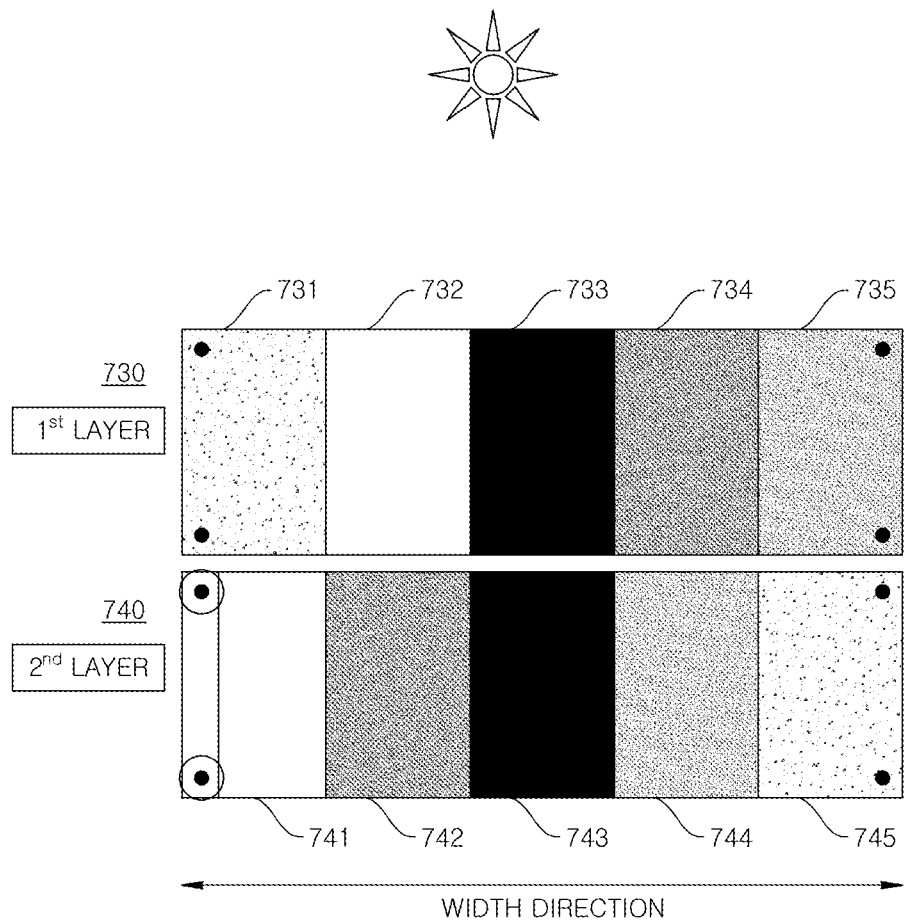
FIG. 17 is a diagram illustrating a wavelength converting unit according to still another embodiment of the present disclosure.

FIG. 15 is a diagram of the wavelength converting unit according to one embodiment of the present disclosure, FIG. 16 is a diagram of the wavelength converting unit according to another embodiment of the present disclosure, and FIG. 17 is a diagram of a wavelength converting unit according to still another embodiment of the present disclosure.

As illustrated in FIG. 15, a wavelength converting unit 710 according to one embodiment of the present disclosure includes a first region 711 including a wavelength conversion material that emits a red color, a second region 712 including a wavelength conversion material that emits a green color, a third region 713 including a wavelength conversion material that emits a blue color, a fourth region 714 that allows the sunlight to be outputted as is, and a fifth region 715 that blocks the sunlight.

The driving unit includes shafts (rollers), which are provided on both sides of the wavelength converting unit 710 to change the region of the wavelength converting unit 710 irradiated with the sunlight, and a motor, which winds or unwinds the wavelength converting unit 710. The driving unit may wind or unwind the wavelength converting unit 710 under the control of the control unit to adjust the position along the width direction L.

The selection of the sizes (colors) of the wavelength converting materials in the wavelength converting film included in the wavelength converting unit 710 and the order of the film configuration may take into consideration the conversion of energy for each wavelength and may be configured in various ways based on information regarding the required wavelengths associated with the size of the greenhouse (glass greenhouse) or vinyl house, plant species, and growth cycle.

Wavelength converting units (wavelength converting films) may be installed separately in regions divided along the length of the facility, depending on the size of the facility and the growth phase of the plants. For example, in a facility having a length of 100 m, the wavelength converting units may be installed separately in intervals of 10 m or 25 m to be controlled independently. The width of the wavelength converting film in each region may be set to match the width of the facility.

As illustrated in FIG. 16, a wavelength converting unit 720 according to another embodiment of the present disclosure includes a first region 721 including a wavelength conversion material that emits a red color, a second region 722 including a wavelength conversion material that emits a blue color, a third region 723 including a wavelength conversion material that emits an arbitrary color obtained by mixing two or more of the wavelength converting materials emitting the red, green, and blue colors, a fourth region 724 that allows the sunlight to be outputted as is, and a fifth region 725 that blocks the sunlight.

The driving unit shafts (rollers), which are provided on both sides of the wavelength converting unit 720 to change the region of the wavelength converting unit 720 irradiated with the sunlight, and a motor, which winds or unwinds the wavelength converting unit 720. The driving unit may wind or unwind the wavelength converting unit 720 under the control of the control unit to adjust the position along the width direction L.

The selection of the sizes or colors of the wavelength converting materials in the wavelength converting film included in the wavelength converting unit 720 and the order of the film configuration may take into consideration the conversion of energy for each wavelength and may be configured in various ways based on information regarding the required wavelengths associated with the size of the greenhouse (glass greenhouse) or vinyl house, plant species, and growth cycle.

In addition, in FIG. 16, a part of the wavelength converting unit 720 is configured by a mixture of wavelength converting materials, and the selection of the sizes (colors) of the mixed wavelength converting materials may be configured in various ways according to information regarding the required wavelengths associated with the plant species and growth cycle.

When forming a wavelength converting film by mixing wavelength converting materials for the red, green, and blue colors or mixing wavelength converting materials for the red and green colors, it is preferable to mix in the wavelength converting materials of longer wavelengths in lower concentrations. As a wavelength conversion material uses all of the light belonging to regions before its region of light emission for excitation, a wavelength conversion material for a red color would emit light by absorbing the light emission from a wavelength conversion material for a blue color. Therefore, if wavelength converting materials for different types of light emission are mixed in the same proportions, the light emissions cannot be obtained in the same intensity.

As illustrated in FIG. 17, a wavelength converting unit according to another embodiment of the present disclosure may be configured with multiple layers including a first layer 730 and a second layer 740.

The first layer 730 of the wavelength converting unit includes regions 731, 734, and 735 coated with wavelength converting materials, a light transmitting region 732, and a light blocking region 733, and the second layer 740 of the wavelength converting unit includes regions 742, 744, and 745 coated with wavelength converting materials, a light transmitting region 741, and a light blocking region 743.

The driving unit includes shafts (rollers), which are provided on both sides of each of the layers 730 and 740 of the wavelength converting unit to change the region in each of the layers 730 and 740 of the wavelength converting unit that is irradiated with the sunlight, and motors, which wind or unwind the respective layers 730 and 740 of the wavelength converting unit. The driving unit may wind or unwind the respective layers 730 and 740 of the wavelength converting unit under the control of the control unit to adjust the position along the width direction L.

The selection of the sizes or colors of the wavelength converting materials in the wavelength converting film included in each layer 730 and 740 of the wavelength converting unit and the order of the film configuration may take into consideration the conversion of energy for each wavelength and may be configured in various ways based on information regarding the required wavelengths associated with the size of the greenhouse (glass greenhouse) or vinyl house, plant species, and growth cycle.

Although it is not illustrated in FIGS. 15 to 17, an arbitrary region from among the divided regions of the wavelength converting film may be formed by stacking a plurality of wavelength converting materials. This will be described below with reference to FIGS. 18 and 19.

Figure 18:
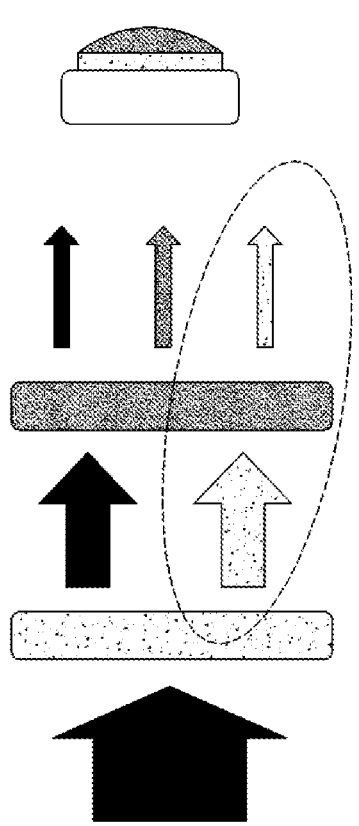
FIGS. 18 and 19 are diagrams illustrating wavelengths and distances from the light source, when the wavelength converting unit is formed to have a stacked or multi-layered structure of wavelength converting materials.
Figure 18:
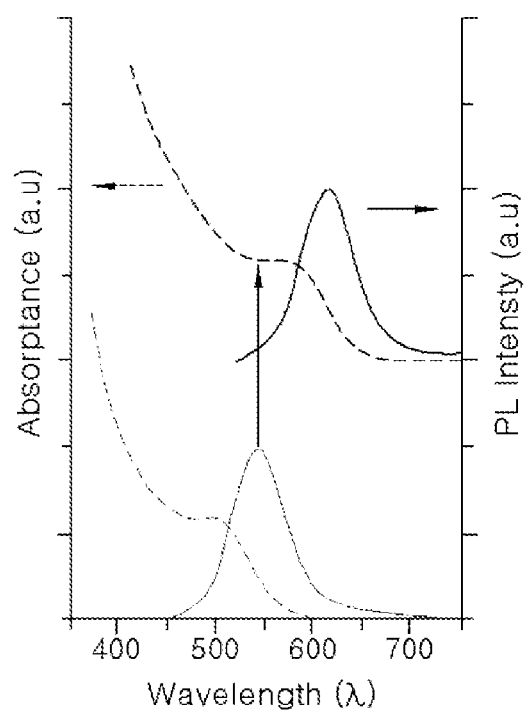
Figure 19:
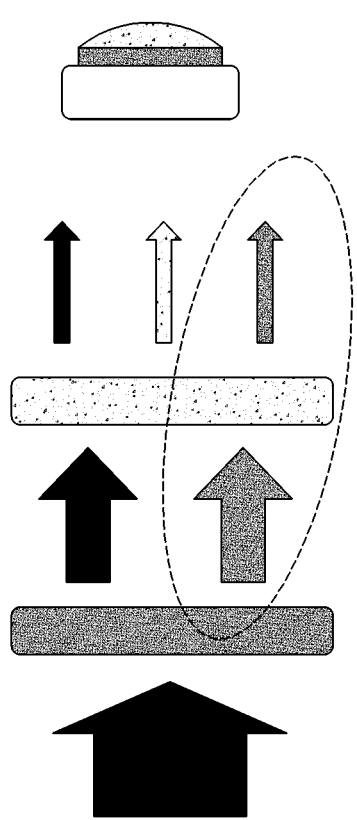
Figure 19:
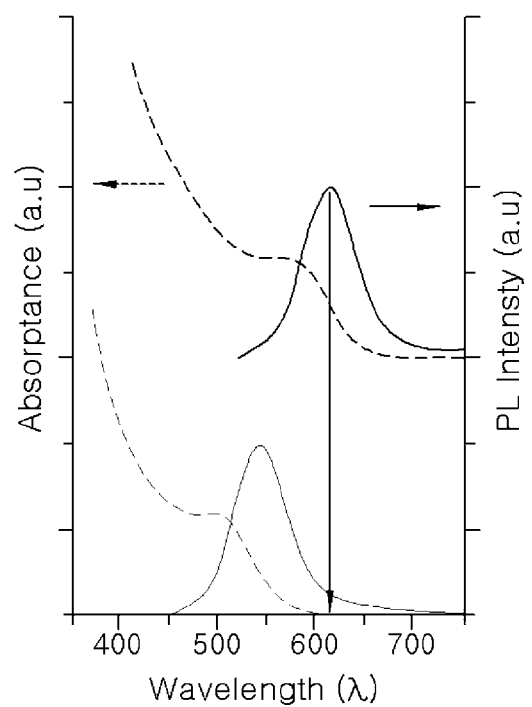

FIGS. 18 and 19 are diagrams illustrating wavelengths and distances from the light source, when the wavelength converting unit is formed to have a stacked or multi-layered structure of wavelength converting materials.

When forming the wavelength converting materials in a layered structure by stacking wavelength converting materials for the red, green, and blue colors or stacking wavelength converting materials for the red and green colors, it is preferable to place the wavelength conversion material for absorbing and emitting a long wavelength at a position adjacent to the light guide plate or diffusion sheet (light source).

That is, it is preferable to place the wavelength conversion material layer for the longest wavelength at the lowermost position, place the wavelength conversion material for the next longest wavelength thereon, and place the wavelength conversion material layer for the shortest wavelength at the top, so as to minimize the loss of light having shorter wavelengths resulting from absorption by wavelength converting materials associated with longer wavelengths.

In FIGS. 18 and 19, the arrows represent the direction of light from the light source, pattern ▩ represents a green color, pattern ■ represents a blue color, and pattern ▨ represents a red color. Also, in the right-hand side graphs of FIGS. 18 and 19, the solid-line curve positioned at the bottom represents the wavelength for the green color, while the solid-line curve positioned at the top represents the wavelength for the red color.

In the example shown in FIG. 18, the light first passes through the wavelength conversion material layer for the green color and then passes through the wavelength conversion material layer for the red color. That is, in the example shown in FIG. 18, when the wavelength conversion material for the green color, which is of a shorter wavelength compared to the red color, is positioned adjacent to the light source, the wavelength conversion material for the red color absorbs blue or green light to emit a red light.

In contrast, in the example shown in FIG. 19, the light first passes through the wavelength conversion material layer for the red color and then passes through the wavelength conversion material layer for the green color. As in the example shown in FIG. 19, when the wavelength conversion material for the red color, which is of a longer wavelength compared to the green color, is positioned adjacent to the light source, the red light emission obtained by the wavelength conversion material is not absorbed. Thus, in order to convert and utilize sunlight efficiently, it is more effective to absorb photons in the ultraviolet range having higher energy and convert the photons into photons of lower energy in a stepwise manner.

The power density of a sunlight spectrum is greater at the short wavelengths of the blue region, and when the wavelength converting film absorbs the higher-energy photons of shorter wavelengths and converts these into lower-energy photons of longer wavelengths, the power density of the converted longer wavelengths may be increased.

Figure 20:
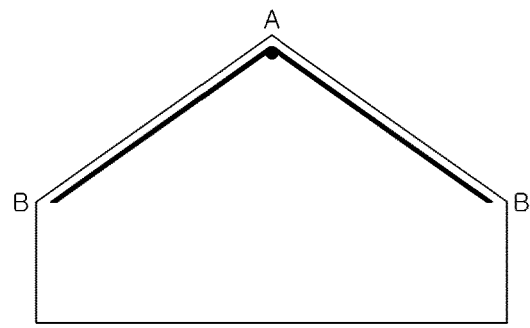
FIGS. 20 to 22 are diagrams illustrating a sunlight converting device including a wavelength converting film using a wavelength conversion material according to yet another embodiment of the present disclosure.
Figure 20:
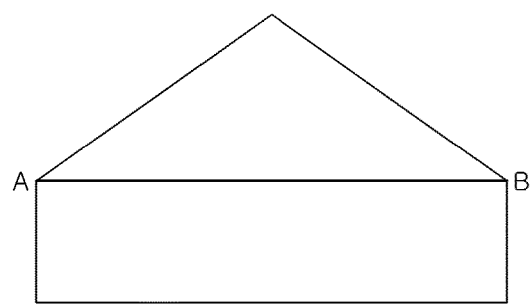
Figure 21:
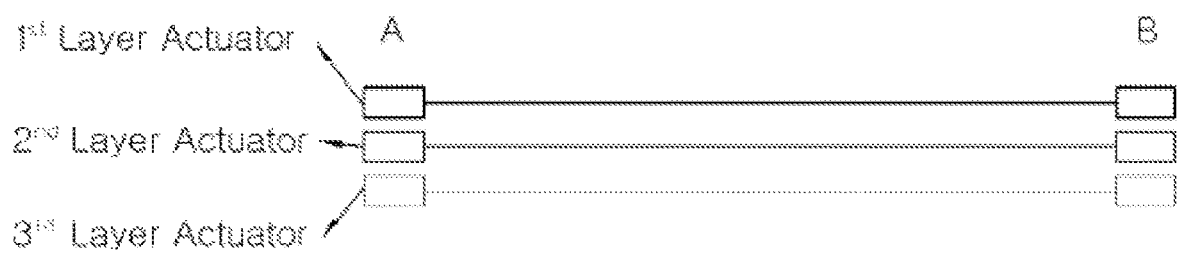
Figure 22:
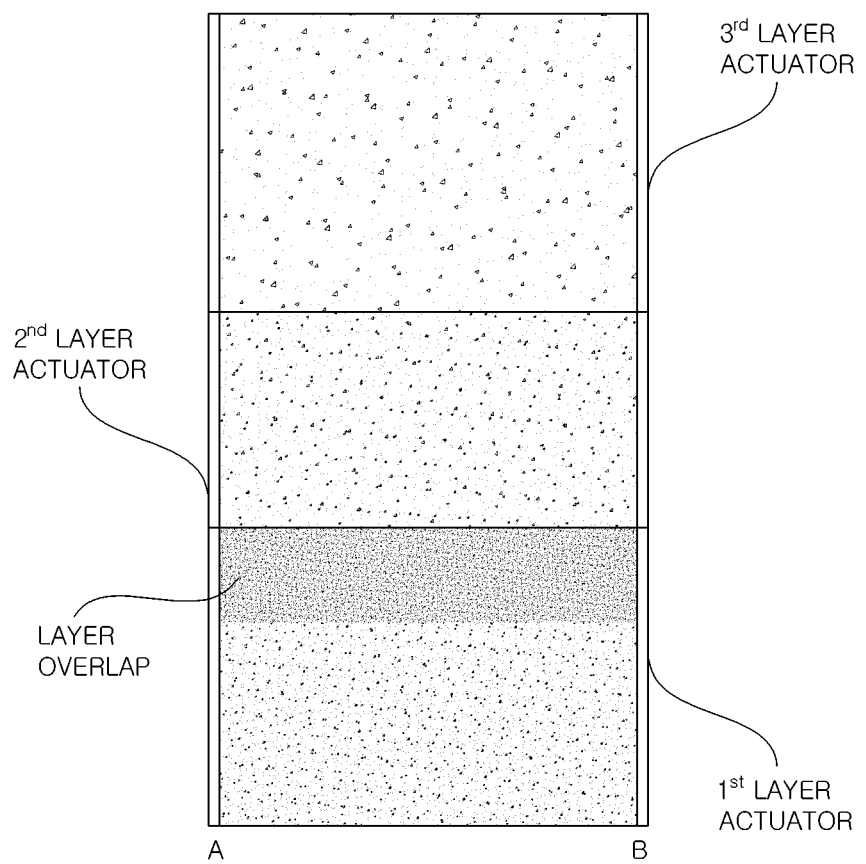

FIGS. 20 to 22 are diagrams illustrating a sunlight converting device including a wavelength converting film using a wavelength conversion material according to yet another embodiment of the present disclosure.

Referring to FIGS. 20 to 22, the wavelength converting unit is configured in a divided multi-layer form so as to optimize growth according to the species and growth cycles of plants and to improve quality of the plants, including microalgae.

As illustrated in FIG. 20, a sunlight converting device including a wavelength converting film using a wavelength conversion material according to another embodiment of the present disclosure may be formed in the shape of the roof at an upper part of a facility or may be formed in a linear shape at the upper part of the facility.

Referring to the front view of FIG. 21 and the plan view of FIG. 22, it is possible to configure the wavelength converting film of each layer into a window-type frame that facilitates movement using a linear actuator, where the overlapping of layers may be used to achieve the same effect as stacking the wavelength converting materials. In the example shown in FIGS. 21 and 22, the first layer actuator is used for the blue layer, the second layer actuator is used for the green layer, and the third layer actuator is used for the red layer.

That is, when the wavelength converting film including wavelength converting materials is configured to have multiple layers, it is effective to position the wavelength conversion material for the blue color, which has a short wavelength, at the top (the first layer actuator), i.e. adjacent to the sunlight, to achieve high efficiency.

When the wavelength converting unit is configured with multiple layers, the selection of the sizes (colors) of the wavelength converting materials may be configured in various ways based on information regarding the wavelengths required according to the species and growth cycles of the plants, including microalgae. Although the figures illustrate each layer as being configured as a film having one type of wavelength conversion material, it is possible for each layer to have films of various colors. Also, as seen in the plan view of FIG. 22, a color other than blue/green/red can be implemented by superimposing portions of the respective layers (portion having overlapped layers in FIG. 22).

Figure 23:
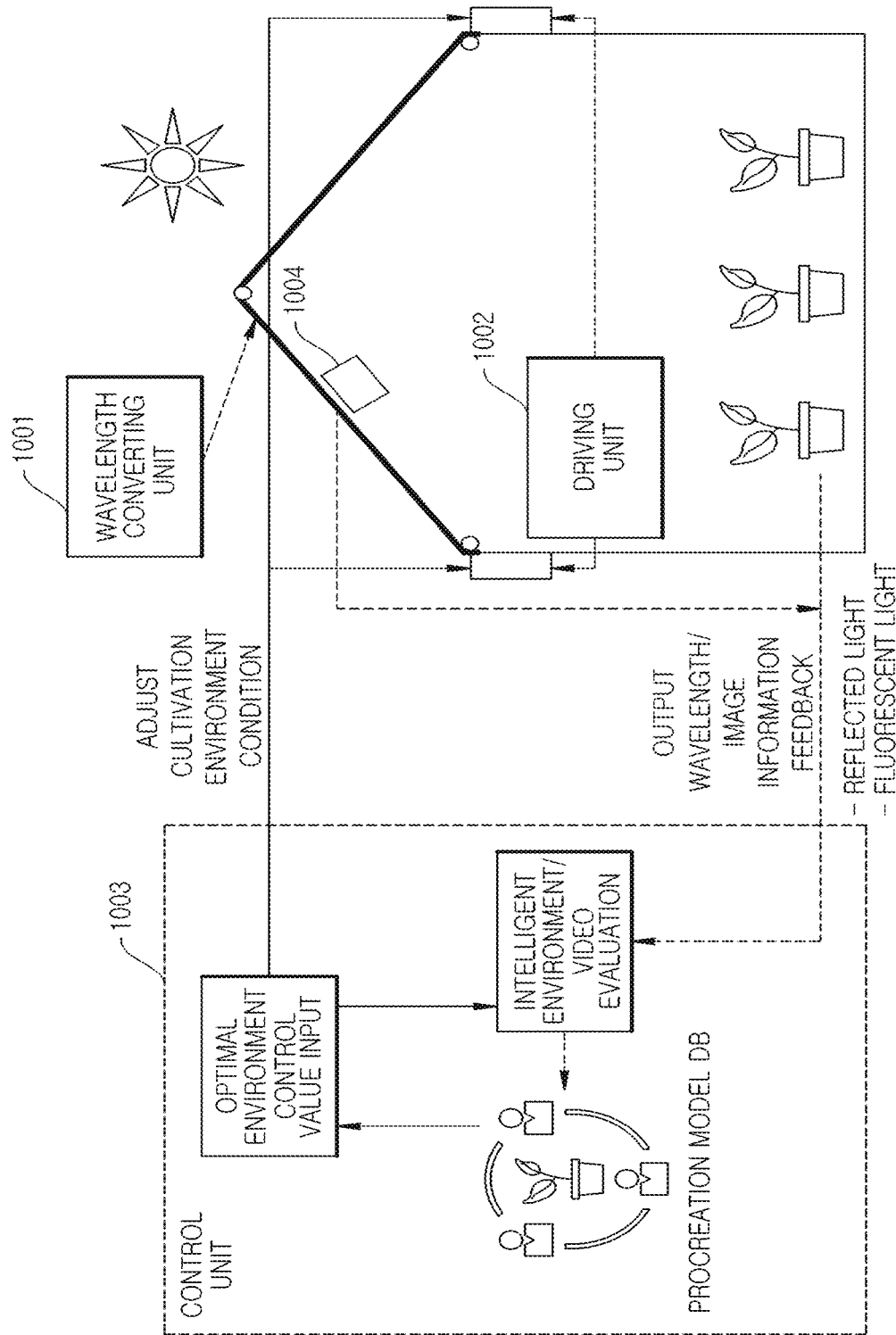
FIG. 23 is an explanatory diagram illustrating a plant cultivation method using a sunlight converting device including a wavelength converting film using a wavelength conversion material according to an embodiment of the present disclosure.

FIG. 23 is an explanatory diagram illustrating a plant cultivation method using a sunlight converting device including a wavelength converting film using a wavelength conversion material according to an embodiment of the present disclosure.

The control unit 1003 controls a driving unit 1002 by referencing information (growth model DB) on the wavelengths required according to the species and growth cycles of plants, including microalgae, to adjust the position of a wavelength converting unit 1001, thereby varying the region of the wavelength converting film irradiated by sunlight.

In addition, the control unit 1003 controls the driving unit 1002 to adjust the position of the wavelength converting unit 1001 such that the wavelengths needed more by the plants are supplied, by providing feedback of image analysis information of the plants and thereby varying the sunlight-irradiated region of the wavelength converting film.

In addition, the control unit may reference feedback information regarding the output wavelengths obtained according to the state of the light source (the sun) and the state of the wavelength converting unit, to control the driving unit 1002 to adjust the position of the wavelength converting unit 1001 in accordance with the state of the sunlight, which is changed according to the day, time, location, and weather, thereby actively providing a customized wavelength.

Figure 24:
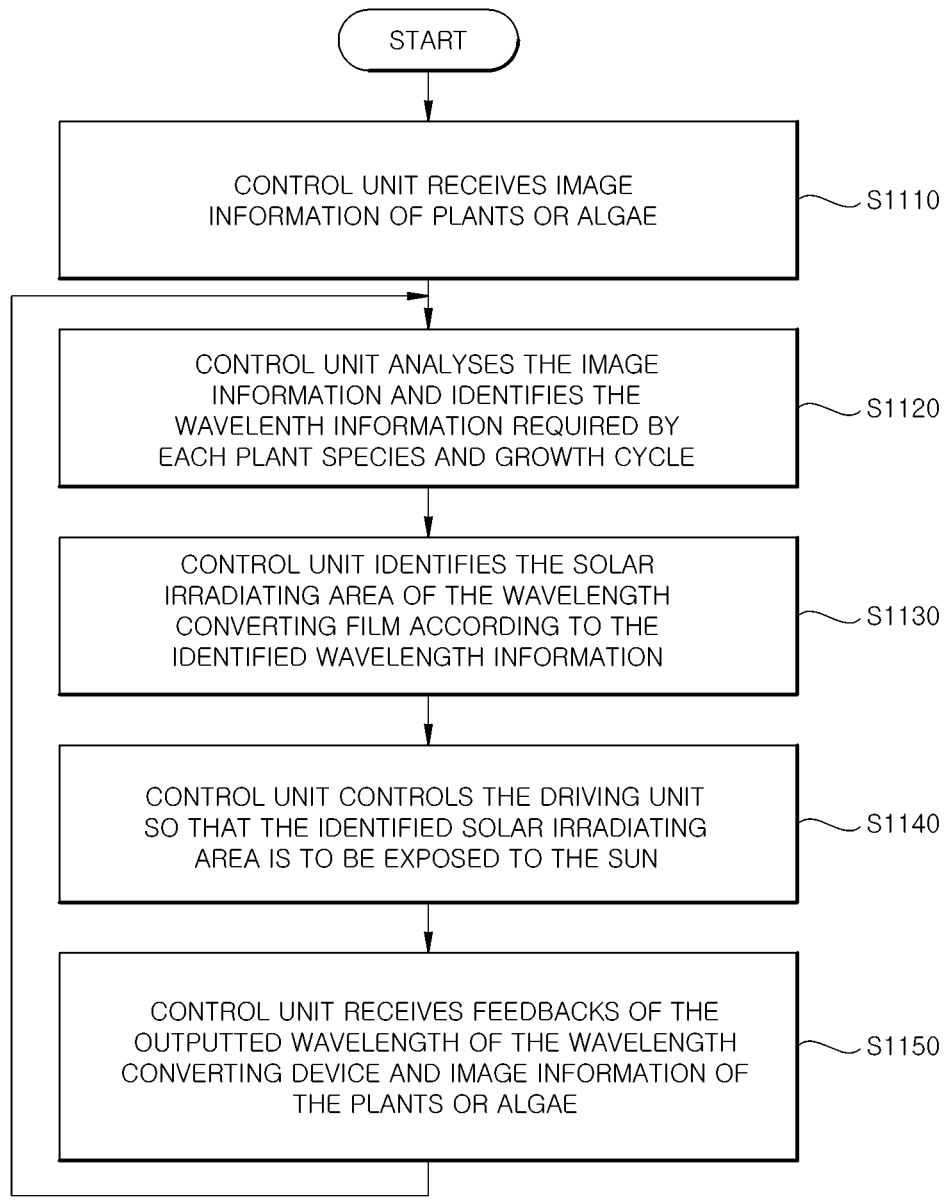
FIG. 24 is a flowchart illustrating a plant cultivation method using a sunlight converting device including a wavelength converting film according to an embodiment of the present disclosure.

FIG. 24 is a flowchart illustrating a plant cultivation method using a sunlight converting device including a wavelength converting film according to an embodiment of the present disclosure.

First, the control unit 1003 receives image information of the cultivated plants or microalgae from an image acquiring unit 1004 (S1110).

The control unit 1003 analyzes the received image information and checks wavelength information required for each species and each growth cycle of the plants, including microalgae (S1120).

The control unit 1003 sets a sunlight-irradiated region of the wavelength converting film according to the checked wavelength information (S1130).

The control unit 1003 controls the driving unit 1002 such that the set sunlight-irradiated region of the wavelength converting film is exposed to the sun (S1140).

While various methods by which the driving unit 1002 may control the wavelength converting unit 1001 including the wavelength converting film in step S1140 have been described above with reference to FIGS. 7 to 13 and FIGS. 20 to 22, the present disclosure is not limited to the above methods.

The wavelength outputted by the sunlight converting device according to the control of the driving unit 1002 by the control unit 1003 and the image information of the cultivated plants or microalgae are received as feedback (S1150).

Thereafter, the procedure moves to step S1120 to continuously control the sunlight-irradiated region of the wavelength converting unit 1001.

Although a plant cultivation method of using a sunlight converting device including a wavelength converting film using a wavelength conversion material according to an embodiment of the present disclosure is described above, it is obviously also possible to implement a computer-readable recorded medium storing a program for implementing the plant cultivation method with a sunlight converting device including a wavelength converting film using a wavelength conversion material, as well as a program stored in the computer-readable recorded medium for implementing the plant cultivation method with a sunlight converting device including a wavelength converting film using a wavelength conversion material.

That is, it will be readily apparent to those skilled in the art that the plant cultivation method using a sunlight converting device including a wavelength converting film using a wavelength conversion material described above may be provided, included in a computer-readable recorded medium that tangibly embodies a program of instructions for implementing the plant cultivation method. In other words, the plant cultivation method can be implemented in the form of program instructions that may be executed using various computer means and can be recorded in a computer-readable medium. Such a computer-readable medium can include program instructions, data files, data structures, etc., alone or in combination. The program instructions recorded on the medium can be designed and configured specifically for the present disclosure or can be a type of medium known to and used by the skilled person in the field of computer software. Examples of a computer-readable medium may include magnetic media such as hard disks, floppy disks, magnetic tapes, etc., optical media such as CD-ROM's, DVD's, etc., magneto-optical media such as floptical disks, etc., and hardware devices such as ROM, RAM, flash memory, USB memory, etc., configured specially for storing and executing program instructions. The recorded medium can also be a transmission medium, such as rays, metal lines, waveguides, etc., which may include carrier waves that transfer signals for specifying program instructions, data structures, etc. Examples of the program of instructions may include not only machine language codes produced by a compiler but also high-level language codes that can be executed by a computer through the use of an interpreter, etc. The hardware mentioned above can be made to operate as one or more software modules that perform the actions of the embodiments of the invention, and vice versa.

The present disclosure is not limited to the above-described embodiments, and it is to be appreciated not only that the present disclosure allows for a broad scope of application but also that the present disclosure may be embodied in numerous variations without departing from the spirit and scope of the invention as defined in the appended claims.

What is claimed is:

1. A sunlight converting device comprising:
a wavelength converting unit including a wavelength converting film and configured to convert a wavelength of sunlight, the wavelength converting film coated with a wavelength conversion material for outputting light corresponding to a predetermined wavelength;
a driving unit configured to move the wavelength converting unit to thereby change a sunlight-irradiated region of the wavelength converting film; and
a control unit configured to control an operation of the driving unit to thereby adjust a wavelength outputted through the wavelength converting unit.

2. The sunlight converting device according to claim 1, wherein the wavelength converting unit is installed under a roof of a greenhouse.

3. The sunlight converting device according to claim 1, wherein the wavelength converting unit is installed as a roof of a greenhouse.

4. The sunlight converting device according to claim 2, wherein the wavelength converting unit is further installed on the inside of wall s of the greenhouse.

5. The sunlight converting device according to claim 1, wherein the wavelength converting unit is installed horizontally across an upper portion of a greenhouse.

6. The sunlight converting device according to claim 5, further comprising a roll type frame supporting a center portion of the wavelength converting unit.

7. The sunlight converting device according to claim 1, wherein the wavelength converting unit has the wavelength converting film wound around two rollers provided on separated position, and the sunlight-irradiated region of the wavelength converting film is changed as the driving unit winds or unwinds at least one of the rollers.

8. The sunlight converting device according to claim 1, wherein the wavelength converting unit has the wavelength converting film provided in a form of a foldable curtain, and the sunlight-irradiated region is changed as the driving unit folds or unfolds the wavelength converting film.

9. The sunlight converting device according to claim 1, wherein the wavelength converting film comprising:
   a polymer resin including divided regions and having a wavelength conversion material coated in each region thereof, the wavelength conversion material configured to convert sunlight into light of a predetermined wavelength and output the converted light; and
   a barrier film laminated on both surfaces of the polymer resin for preventing deterioration of the wavelength conversion material.

10. The sunlight converting device according to claim 1, wherein the wavelength converting film includes a plurality of separated regions, and
   wherein the plurality of separated regions comprise:
   a first region including a wavelength conversion material emitting red color;
   a second region including a wavelength conversion material emitting green color;
   a third region including a wavelength conversion material emitting blue color;
   a fourth region including a wavelength conversion material emitting colors other than red, green, and blue by mixing two or more wavelength converting materials of red, green, and blue;
   a fifth region configured to allow sunlight to pass through the fifth region without conversion; and
   a sixth region configured to block the sunlight.

11. The sunlight converting device according to claim 1, wherein the wavelength conversion material comprises either quantum dots or inorganic phosphors.

12. The sunlight converting device according to claim 1, further comprising:
   a sensor unit configured to sense a state and a wavelength of the sunlight,
   wherein the control unit controls the driving unit to adjust the sunlight-irradiated region of the wavelength converting unit depending on a state of the sunlight varying according to a day, time, a location, and weather, based on the state and the wavelength of the sunlight transmitted from the sensor unit.

* * * * *